US012562737B2

(12) United States Patent
Zhu et al.

(10) Patent No.: US 12,562,737 B2
(45) Date of Patent: Feb. 24, 2026

(54) SWITCH LINEARIZATION WITH ASYMMETRICAL ANTI-SERIES VARACTOR PAIR

(71) Applicant: SKYWORKS SOLUTIONS, INC., Irvine, CA (US)

(72) Inventors: Yu Zhu, Wellesley, MA (US); Oleksiy Klimashov, Burlington, MA (US); Paul T DiCarlo, Marlborough, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 21 days.

(21) Appl. No.: 18/789,400

(22) Filed: Jul. 30, 2024

(65) Prior Publication Data

US 2025/0119139 A1 Apr. 10, 2025

Related U.S. Application Data

(63) Continuation of application No. 18/141,927, filed on May 1, 2023, now Pat. No. 12,052,015, which is a continuation of application No. 17/567,079, filed on Dec. 31, 2021, now Pat. No. 11,641,204.

(60) Provisional application No. 63/133,105, filed on Dec. 31, 2020.

(51) Int. Cl.
| | |
|---|---|
| *H03K 17/693* | (2006.01) |
| *H03K 17/16* | (2006.01) |
| *H04B 1/44* | (2006.01) |
| *H10D 1/64* | (2025.01) |

(52) U.S. Cl.
CPC ......... *H03K 17/693* (2013.01); *H03K 17/161* (2013.01); *H04B 1/44* (2013.01); *H10D 1/64* (2025.01)

(58) Field of Classification Search
CPC ........ H01L 29/93; H04B 1/44; H03K 17/693; H03K 17/161; H10D 1/64
See application file for complete search history.

(56) References Cited

U.S. PATENT DOCUMENTS

| | | | | |
|---|---|---|---|---|
| 8,786,002 B2 * | 7/2014 | Kondo | ..................... | H04B 1/48 |
| | | | | 257/E29.345 |
| 9,236,957 B2 * | 1/2016 | Bolton | ................... | H04B 15/02 |
| 9,240,770 B2 * | 1/2016 | Kerr | ..................... | H03K 17/693 |
| 9,467,196 B2 * | 10/2016 | Imbornone | .......... | H04B 1/0475 |
| 9,590,669 B2 * | 3/2017 | Wright | ................. | H04B 1/0475 |
| 10,692,862 B2 * | 6/2020 | Ahmad | .................... | H10D 1/64 |

(Continued)

OTHER PUBLICATIONS

Written Opinion of the International Searching Authority for PCT/US2021/065851, May 17, 2022, in 3 pages. (Year: 2022).*

(Continued)

*Primary Examiner* — Menatoallah Youssef
*Assistant Examiner* — Colleen J O Toole
(74) *Attorney, Agent, or Firm* — Chang & Hale LLP

(57) ABSTRACT

Described herein are switches with asymmetrical anti-series varactor pairs to improve switching performance. The disclosed switches can include asymmetrical varactor pairs to reduce distortions. The asymmetry in the varactor pairs can be associated with geometry of each varactor in the pair. The disclosed switches can stack both symmetrical and asymmetrical varactor pairs. The disclosed switches with asymmetrical anti-series varactor pairs can be configured to improve both H2 and H3 simultaneously.

20 Claims, 19 Drawing Sheets

(56) References Cited

U.S. PATENT DOCUMENTS

| | | | |
|---|---|---|---|
| 2009/0181630 A1* | 7/2009 | Seshita | H04B 1/006 |
| | | | 455/191.3 |
| 2009/0245309 A1* | 10/2009 | Khalouf | H04B 10/6972 |
| | | | 327/545 |
| 2015/0022024 A1* | 1/2015 | Dicicco | H03K 17/162 |
| | | | 307/109 |
| 2016/0365427 A1* | 12/2016 | Wright | H10D 1/045 |
| 2017/0288659 A1* | 10/2017 | Scott | H03K 17/145 |
| 2018/0337670 A1* | 11/2018 | Zhu | H03K 17/16 |
| 2020/0382114 A1* | 12/2020 | Scott | H03K 17/567 |

OTHER PUBLICATIONS

International Search Report for PCT/US2021/065851, May 17, 2022, in 3 pages (Year: 2022).*

* cited by examiner $$Q = C_{off}V + \frac{1}{6}C_{d3}V^3$$

$$\frac{1}{C_{ds}} = \frac{1}{C_{gs}} + \frac{1}{C_{gd}}$$

$$C_{gs} = C_{gd} \quad \text{if } V_{gs} = V_{gd}$$

$$C_{gs} = 2C_{ds}$$

$$C_{gs}(v) = C_{gs0} + C_{gs2}v + \frac{1}{2}C_{gs3}v^2$$

Measurement

Fitting

Vgs (V)

Cgs (F)

Cgs            Cgd

G

Coff(Vds)

$$C_{off}(v) = C_{off} + \frac{1}{2} C_{d3} v^2$$

$$C_{d3} = \frac{1}{8}\left[ C_{gs3} - \frac{3C_{gs2}^2}{C_{gs0}} \right]$$

$$C_{gs}(v) = C_{gs0} + C_{gs2}v + \frac{1}{2}C_{gs3}v^2$$

$$C_{gd}(v) = C_{gd0} + C_{gd2}v + \frac{1}{2}C_{gd3}v^2$$

$$C_{off}(v) = C_{off} + C_{d2}v + \frac{1}{2}C_{d3}v^2$$

$$C_{d2} \propto \left[ \frac{C_{gs2}}{2C_{gs0}^3} - \frac{C_{gd2}}{2C_{gd0}^3} \right]$$

*1602*    *1600*    *1604*

POLE(S)    RF SWITCH    THROW(S)

*1602a*    *1600*

*1604a*    RF CORE    *1604b*

*1610*

*1612*    ENERGY MANAGEMENT (EM) CORE

SWITCH LINEARIZATION WITH ASYMMETRICAL ANTI-SERIES VARACTOR PAIR

CROSS-REFERENCE TO RELATED APPLICATIONS

This application is a continuation of U.S. application Ser. No. 18/141,927 filed May 1, 2023 and entitled "SWITCH LINEARIZATION WITH ASYMMETRICAL ANTI-SE-RIES VARACTOR PAIR," which is a continuation of U.S. application Ser. No. 17/567,079 filed Dec. 31, 2021 and entitled "SWITCH LINEARIZATION WITH ASYM-METRICAL ANTI-SERIES VARACTOR PAIR" (now U.S. Pat. No. 11,641,204 issued May 2, 2023), which claims priority to U.S. Prov. App. No. 63/133,105 filed Dec. 31, 2020 and entitled "SWITCH LINEARIZATION WITH ASYMMETRICAL ANTI-SERIES VARACTOR PAIR," which is expressly incorporated by reference herein in its entirety for all purposes.

This application is related to U.S. Pat. Pub. No. 2018/0183431 filed Dec. 22, 2017 and published Jun. 28, 2018, entitled "Switch Linearization By Compensation of a Field-Effect Transistor," and is also related to U.S. Pat. Pub. No. 2014/0009214, filed Jul. 6, 2013 and published Jan. 9, 2014, entitled "Circuits, Devices, Methods and Applications Related to Silicon-on-Insulator Based Radio-Frequency Switches," and is also related to U.S. Pat. Pub. No. 2018/0337670, filed May 16, 2018 and published Nov. 22, 2018, entitled "Switch linearization with anti-series varactor," each of which is expressly incorporated by reference herein in its entirety for all purposes.

BACKGROUND

Field

The present disclosure generally relates to the field of electronics, and more particularly, to radio-frequency switches.

Description of Related Art

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

SUMMARY

According to a number of implementations, the present disclosure relates to a radio-frequency switch. The switch includes a series arm coupled between an input node and an output node. The switch includes a shunt arm having a set of field-effect transistors, the shunt arm coupled between the series arm and a reference node. The switch includes a varactor stack comprising an asymmetric anti-series varac-tor pair, the varactor stack coupled in parallel to the shunt arm between the series arm and the reference potential node, the varactor stack configured to simultaneously reduce sec-ond order distortions and third order distortions generated by the set of field-effect transistors in the shunt arm. In some embodiments, the varactor stack comprises a stack of asymmetric anti-series varactor pairs. In further embodiments, the varactor stack does not include any sym-metric anti-series varactor pairs. In some embodiments, the varactor stack includes a symmetric anti-series varactor pairs.

In some embodiments, the asymmetric anti-series varac-tor pair has a first varactor with a first width and a second varactor with a second width, the first varactor coupled in an anti-series configuration with the second varactor, the first width and the second width having a difference tailored to reduce the second order harmonics generated by the set of field-effect transistors of the shunt arm. In some embodi-ments, the asymmetric anti-series varactor pair has a first varactor with a first width and a second varactor with a second width, the first varactor coupled in an anti-series configuration with the second varactor, the first width and the second width tailored to reduce the third order harmonics generated by the set of field-effect transistors of the shunt arm. In some embodiments, the series arm comprises a plurality of field-effect transistors.

According to a number of implementations, the present disclosure relates to a radio-frequency switch module. The module includes a packaging substrate configured to receive a plurality of components. The module includes a semicon-ductor die mounted on the packaging substrate, the semi-conductor die including a switch that includes a series arm coupled between an input node and an output node; the switch including a shunt arm having a set of field-effect transistors, the shunt arm coupled between the series arm and a reference node; and the switch including a varactor stack comprising an asymmetric anti-series varactor pair, the varactor stack coupled in parallel to the shunt arm between the series arm and the reference potential node, the varactor stack configured to simultaneously reduce second order distortions and third order distortions generated by the set of field-effect transistors in the shunt arm.

In some embodiments, the varactor stack comprises a stack of asymmetric anti-series varactor pairs. In further embodiments, the varactor stack does not include any sym-metric anti-series varactor pairs. In some embodiments, the varactor stack includes a symmetric anti-series varactor pairs.

In some embodiments, the asymmetric anti-series varac-tor pair has a first varactor with a first width and a second varactor with a second width, the first varactor coupled in an anti-series configuration with the second varactor, the first width and the second width having a difference tailored to reduce the second order harmonics generated by the set of field-effect transistors of the shunt arm. In some embodi-ments, the asymmetric anti-series varactor pair has a first varactor with a first width and a second varactor with a second width, the first varactor coupled in an anti-series configuration with the second varactor, the first width and the second width tailored to reduce the third order harmonics generated by the set of field-effect transistors of the shunt arm. In some embodiments, the series arm comprises a plurality of field-effect transistors.

According to a number of implementations, the present disclosure relates to a wireless device. The device includes a transceiver configured to process radio-frequency (RF) signals. The device includes an antenna in communication with the transceiver configured to facilitate transmission of an amplified RF signal. The device includes a power ampli-fier connected to the transceiver and configured to generate the amplified RF signal. The device includes a switch connected to the antenna and the power amplifier and configured to selectively route the amplified RF signal to the antenna, the switch including a series arm coupled between an input node and an output node; the switch including a shunt arm having a set of field-effect transistors, the shunt arm coupled between the series arm and a reference node; and the switch including a varactor stack comprising an asymmetric anti-series varactor pair, the varactor stack coupled in parallel to the shunt arm between the series arm and the reference potential node, the varactor stack configured to simultaneously reduce second order distortions and third order distortions generated by the set of field-effect transistors in the shunt arm.

In some embodiments, the varactor stack comprises a stack of asymmetric anti-series varactor pairs. In further embodiments, the varactor stack does not include any symmetric anti-series varactor pairs. In some embodiments, the varactor stack includes a symmetric anti-series varactor pairs.

In some embodiments, the asymmetric anti-series varactor pair has a first varactor with a first width and a second varactor with a second width, the first varactor coupled in an anti-series configuration with the second varactor, the first width and the second width having a difference tailored to reduce the second order harmonics generated by the set of field-effect transistors of the shunt arm. In some embodiments, the asymmetric anti-series varactor pair has a first varactor with a first width and a second varactor with a second width, the first varactor coupled in an anti-series configuration with the second varactor, the first width and the second width tailored to reduce the third order harmonics generated by the set of field-effect transistors of the shunt arm.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

4

Figure 11:
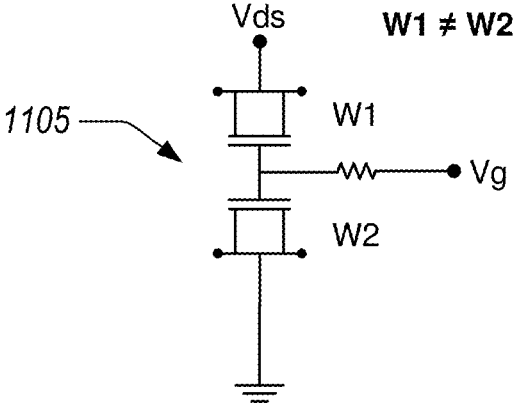

FIG. 11 illustrates an asymmetrical anti-series varactor pair.

Figure 12:
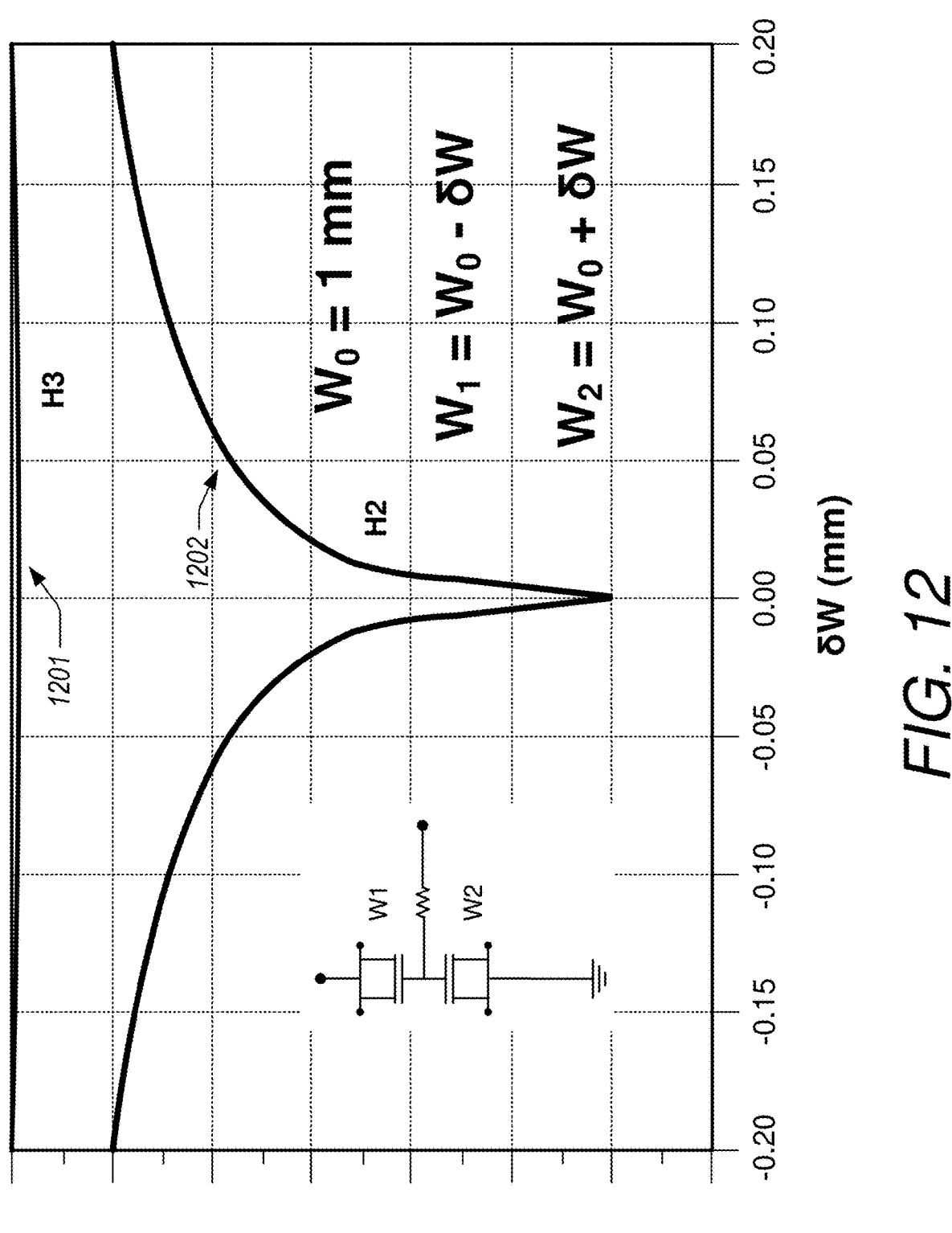

FIG. 12 illustrates simulated measurements of the magnitude of 2nd and 3rd order harmonics as a function of the difference in widths of the two varactors (δW).

Figure 13:
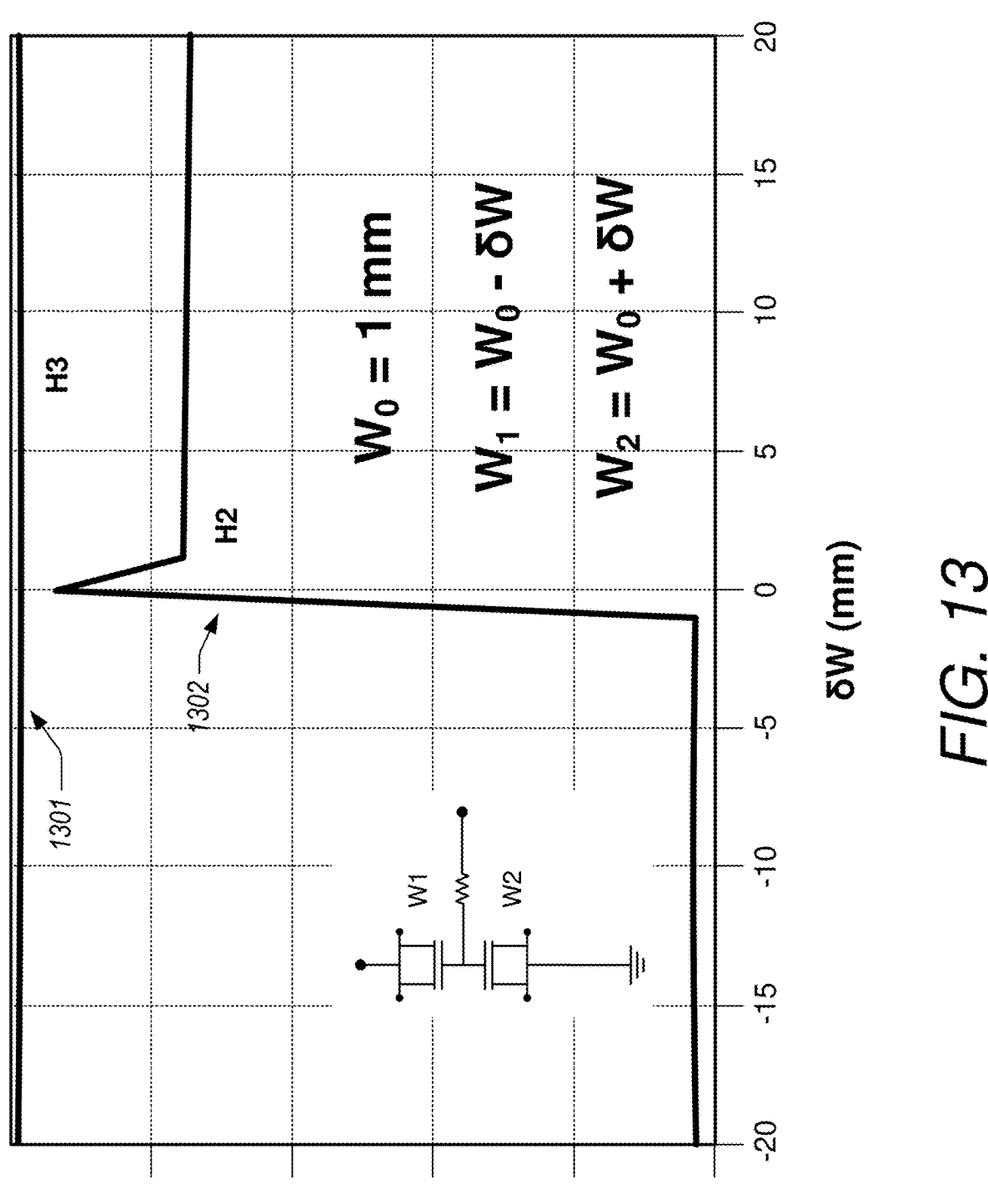

FIG. 13 illustrates simulated measurements of the phase of 2nd and 3rd order harmonics as a function of the difference in widths of the two varactors (δW).

Figure 14:
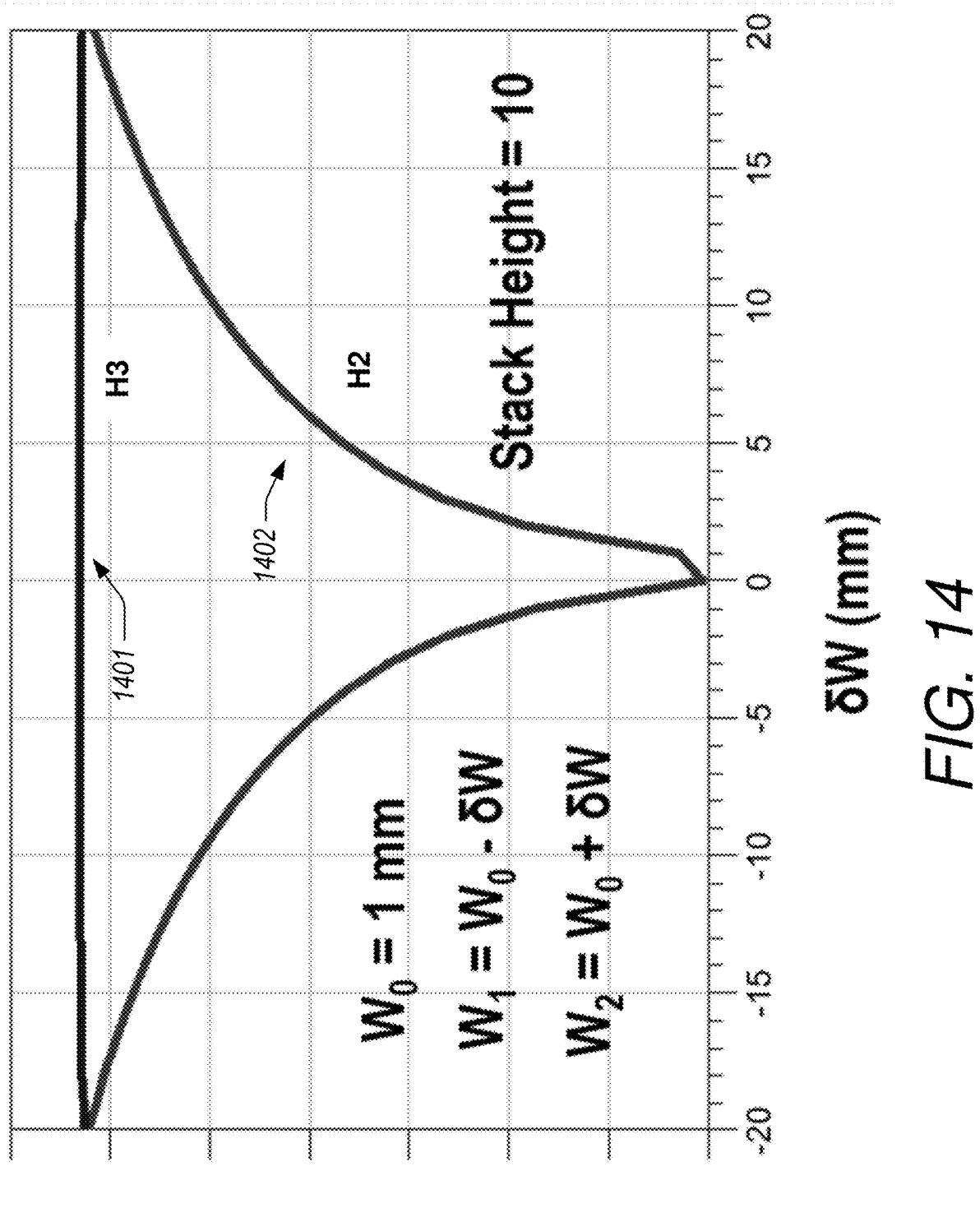

FIG. 14 illustrates a stack of asymmetrical varactor pairs.

Figure 15:
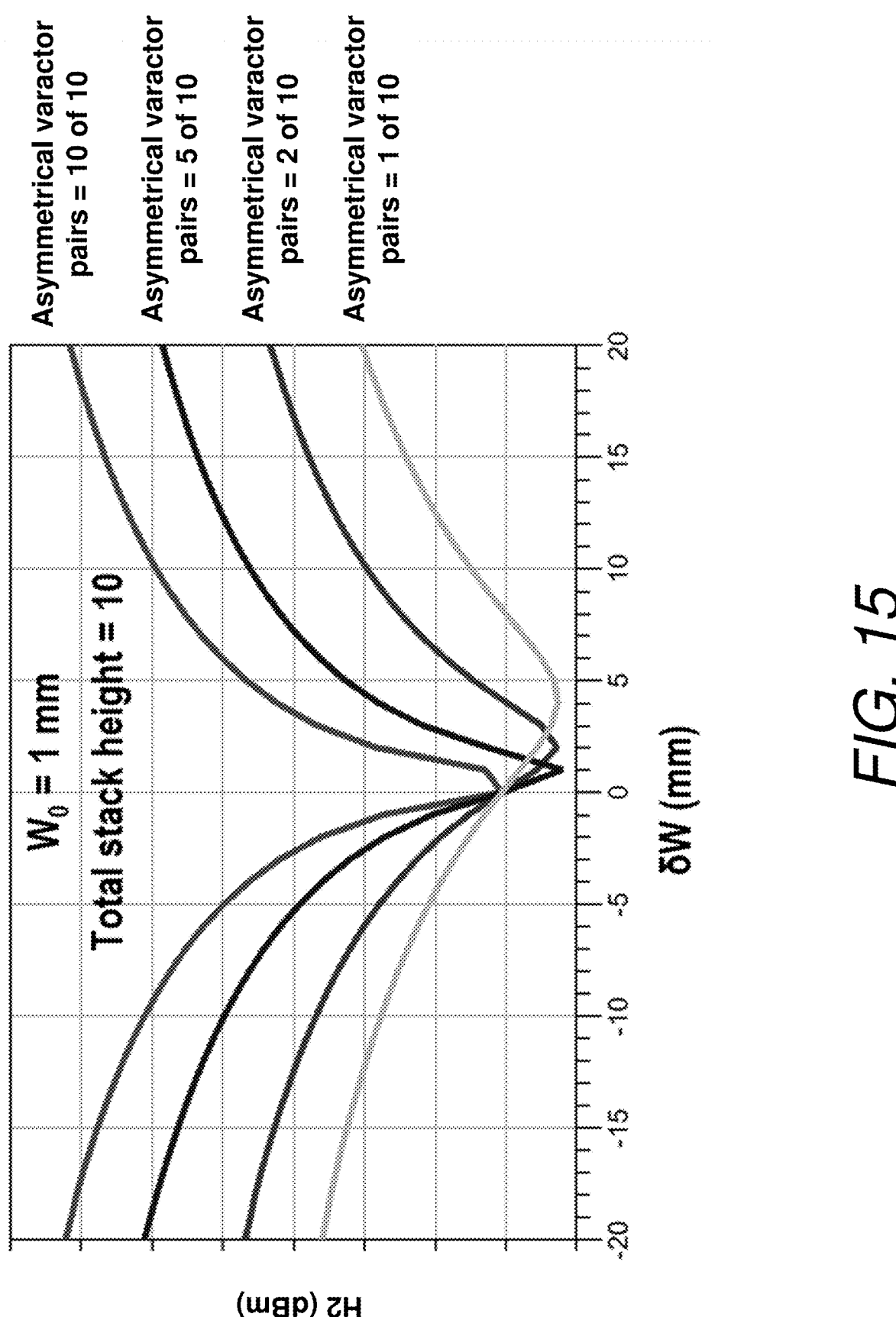

FIG. 15 illustrates the behavior of both symmetrical and asymmetrical varactor pairs.

Figures 16, 17:
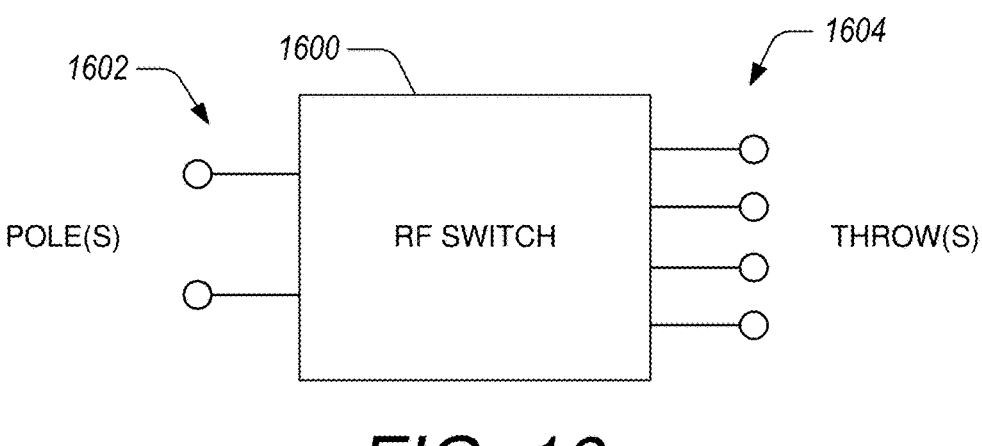

FIG. 16 schematically shows a radio-frequency switch configured to switch one or more signals between one or more poles and one or more throws.

FIG. 17 shows that in some implementations, the RF switch of FIG. 16 can include an RF core and an energy management (EM) core.

Figure 18:
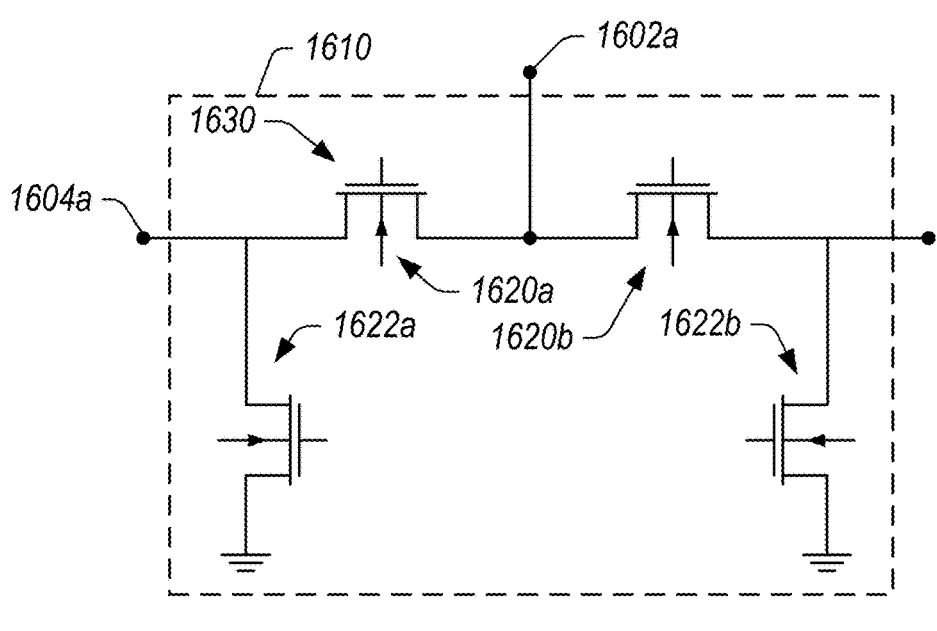

FIG. 18 shows a more detailed example configuration of an RF core.

Figure 19:
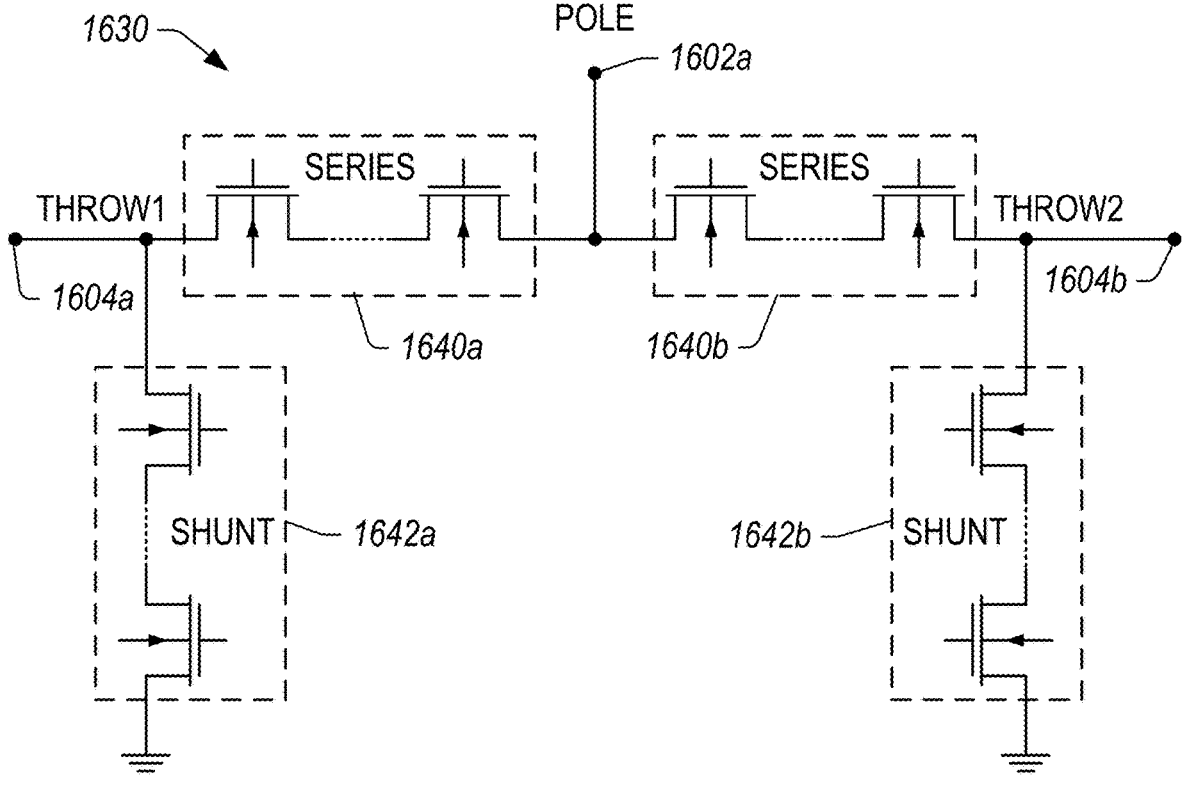

FIG. 19 shows an example RF core configuration of an RF core having switch arm segments with stacked FETs.

Figure 20:
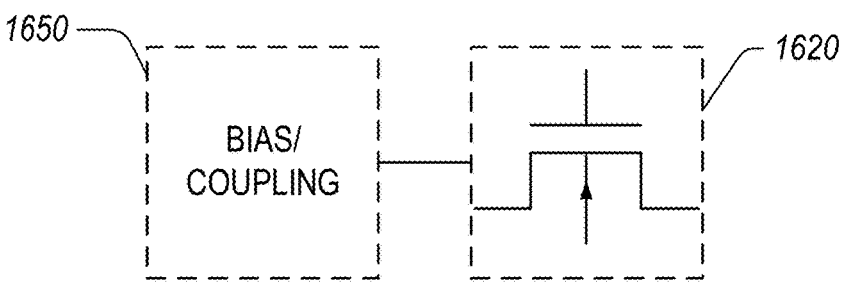

FIG. 20 schematically shows that in some implementations, such controlling of an FET can be facilitated by a circuit configured to bias and/or couple one or more portions of the FET.

Figure 21:
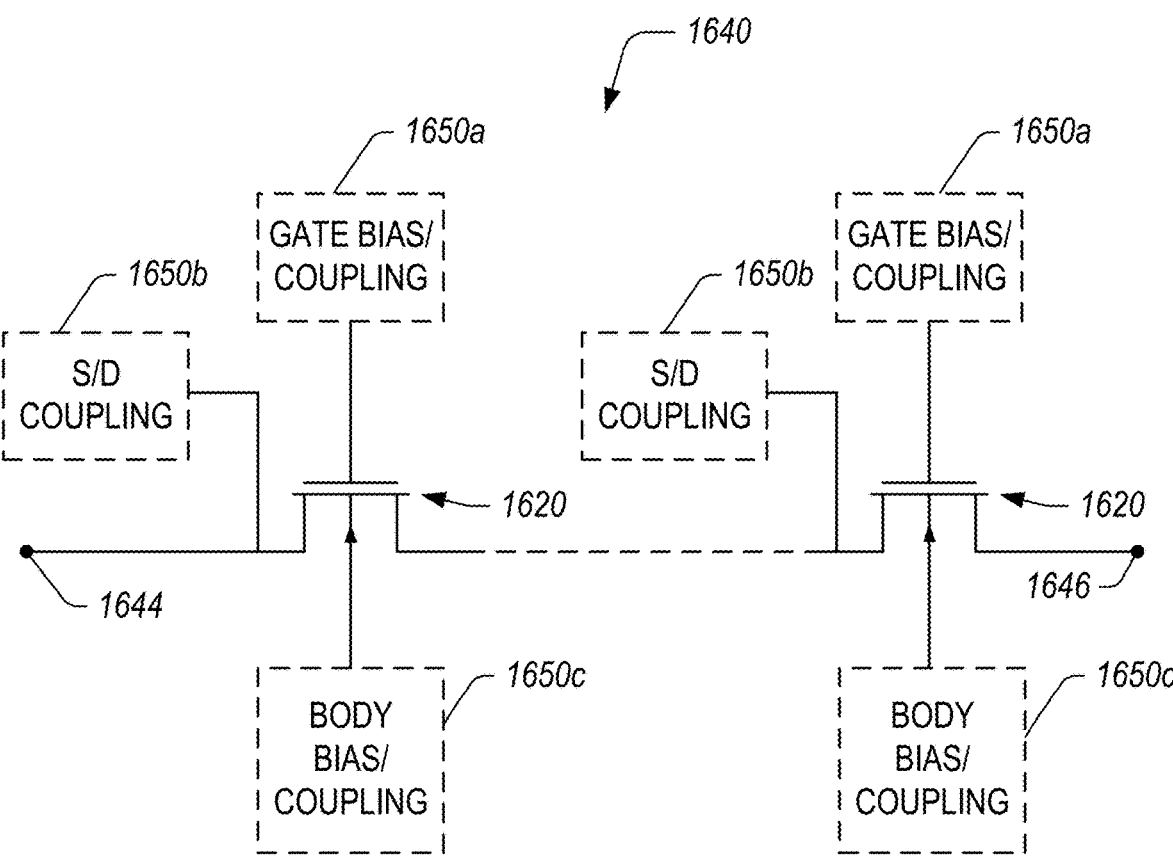

FIG. 21 illustrates schematic examples of biasing and/or coupling of different parts of one or more FETs.

Figure 22:
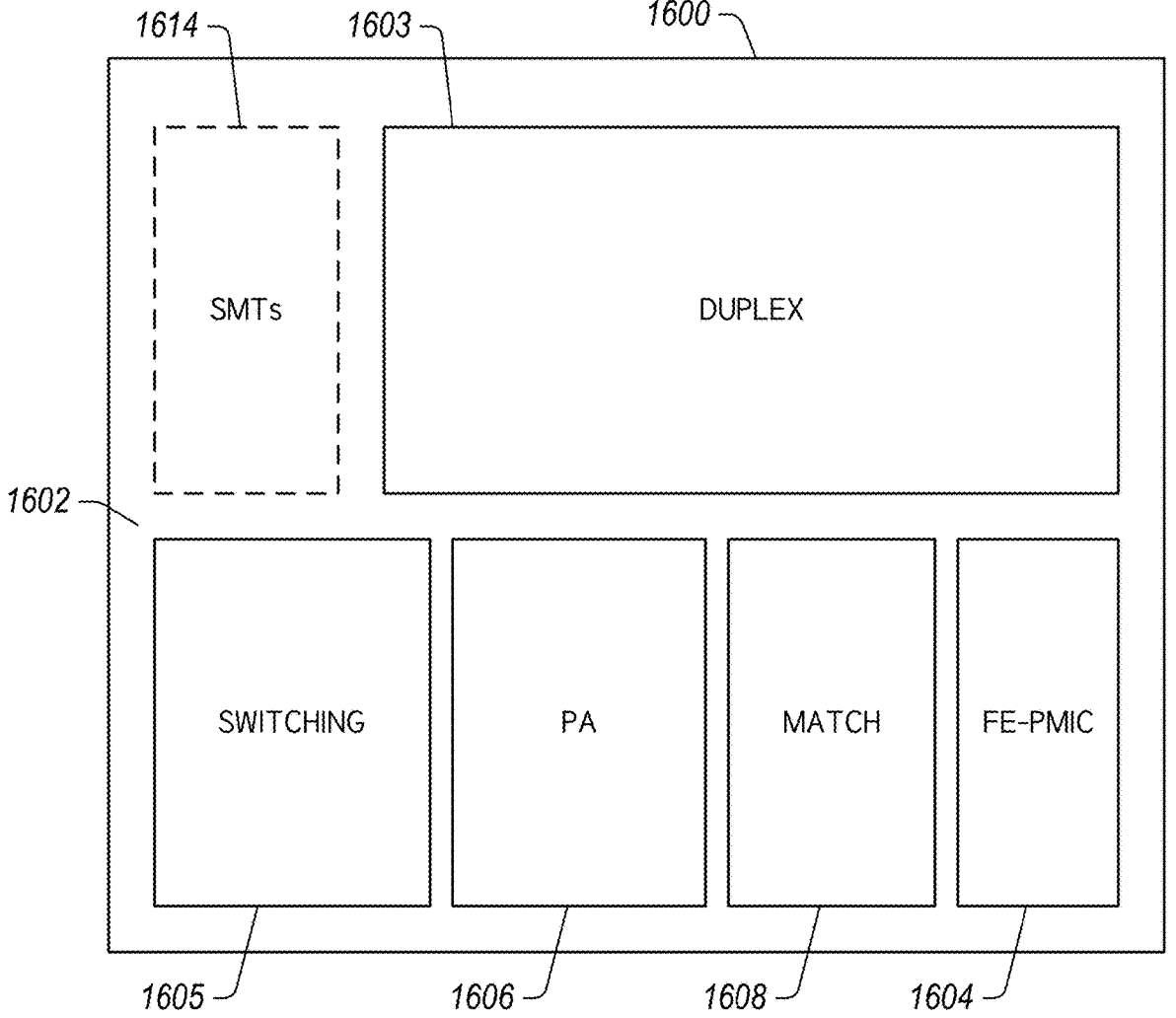

FIG. 22 shows that switches having one or more features as described herein may be implemented in a module.

Figure 23:
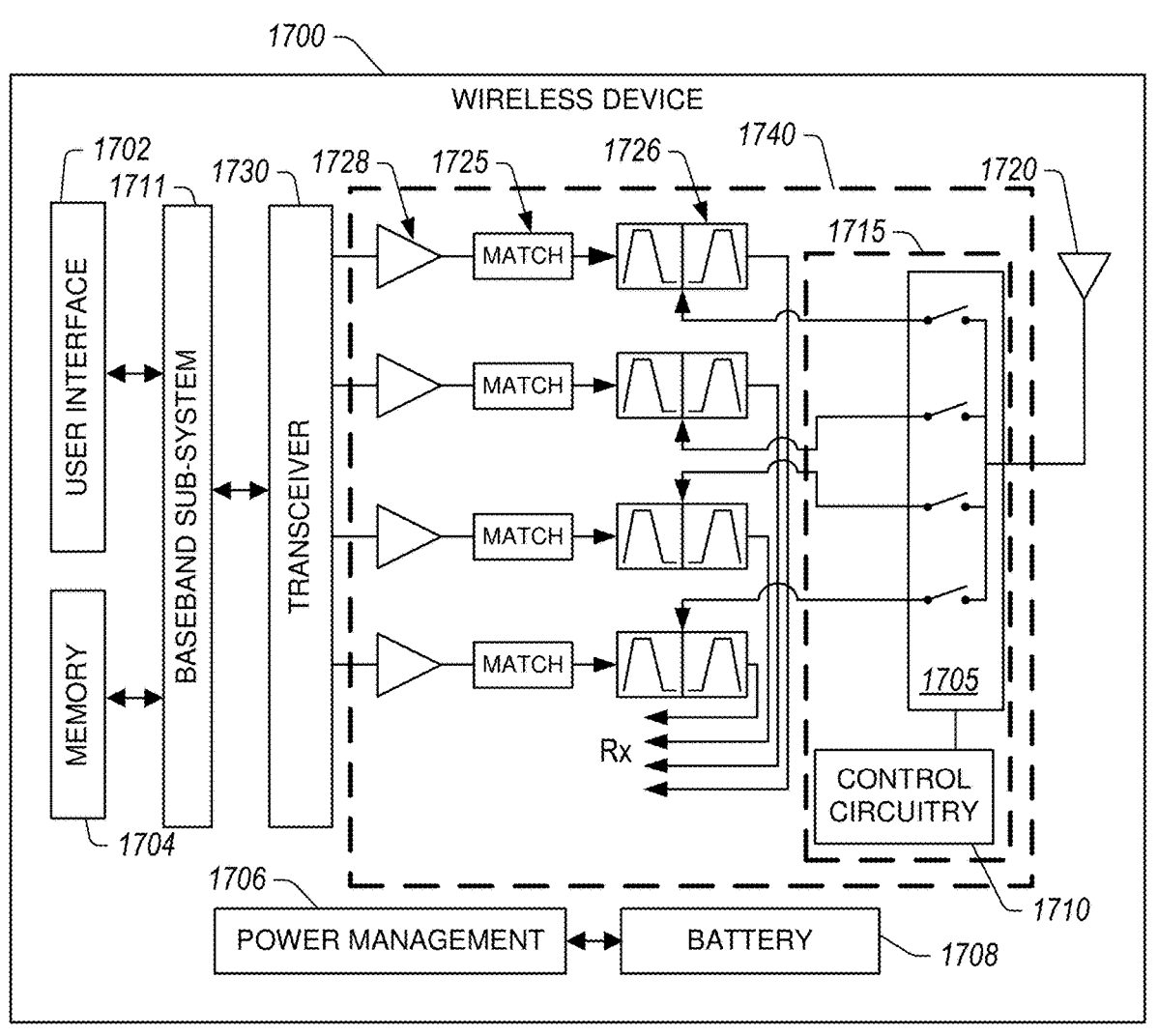

FIG. 23 schematically depicts an example wireless device having one or more advantageous features described herein.

DETAILED DESCRIPTION OF SOME EMBODIMENTS

The headings provided herein, if any, are for convenience only and do not necessarily affect the scope or meaning of the claimed subject matter.

Overview

Described herein are switches with asymmetrical anti-series varactor pairs to improve switching performance. The disclosed switches can include asymmetrical varactor pairs to reduce distortions. The asymmetry in the varactor pairs can be associated with geometry of each varactor in the pair. The width (e.g., W0) of the varactors can be configured to control or reduce 3rd order harmonics (or H3) while a width difference (e.g., delta W or δW) can be configured to control or reduce 2nd order harmonics (or H2). For example, a first varactor can have a width W1 that is a base width (W0) minus a width difference (δW) or W1=W0−δW while the second varactor pair can have a width W2 that is the base width (W0) plus the width difference (δW) or W2=W0+δW. The width difference, δW, can be tuned to control or reduce the magnitude and/or phase of H2 distortions. The disclosed switches can stack both symmetrical and asymmetrical varactor pairs. The disclosed switches with asymmetrical anti-series varactor pairs can be configured to improve both H2 and H3 simultaneously. As used herein, the term "anti-series" can refer to varactors (e.g., diodes) where the polarity or preferred direction of the varactors are pointing opposite directions (e.g., towards one another). Examples of implementing symmetrical varactor pairs are provided in U.S. Pat. Pub. No. 2018/0337670, which is incorporated herein by reference in its entirety.

In radio-frequency (RF) applications, switching can be an important factor in RF performance. To improve RF performance and switch performance, it is desirable to use linear switches with small or reduced 2nd and 3rd order distortions. Accordingly, disclosed herein are switch configurations that reduce or cancel both 2nd and 3rd order distortions simultaneously. The disclosed architectures or circuits can be implemented in any suitable switching configuration, examples of which are provided in U.S. Pat. Pub. No. 2018/0183431, which is incorporated herein by reference in its entirety.

The disclosed architectures and circuits reduce or cancel both 2nd and 3rd order distortions simultaneously with asymmetrical anti-series varactor pairs. The disclosed circuit configurations control 3rd order distortions using a total gate width of the varactor (e.g., W0). The disclosed circuit configurations control 2nd order distortions with a gate width offset (e.g., δW) of the asymmetrical varactor pair.

Varactors can be varactor diodes, varicap diodes, variable capacitance diodes, variable reactance diodes, tuning diodes, or the like. A varactor can be a P-N junction diode that changes its capacitance and the series resistance as the bias applied to the diode is varied. The capacitance change of a varactor, for example, can be used to achieve a change in the frequency and/or phase of an electrical circuit.

Varactors are typically operated in a reverse-biased state, so no DC current flows through the device. The amount of reverse bias controls the thickness of the depletion zone and therefore the junction capacitance of the varactor. Generally, the depletion region thickness is proportional to the square root of the applied voltage, and capacitance is inversely proportional to the depletion region thickness. Thus, the capacitance is inversely proportional to the square root of applied voltage. All diodes typically exhibit this variable junction capacitance, but varactors are typically manufactured to exploit the effect and increase the capacitance variation.

Examples of Asymmetrical, Anti-Series Varactor Pairs

Figure 1:
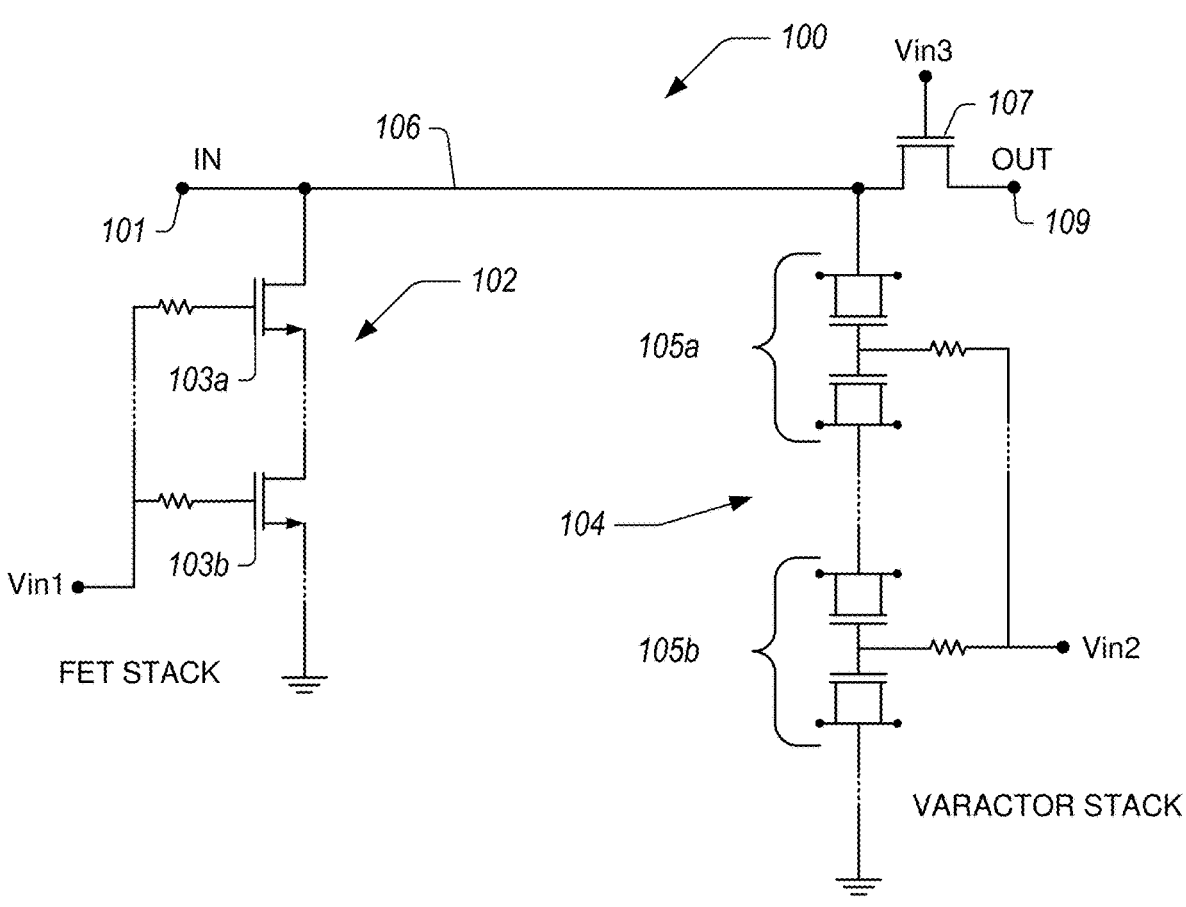
FIG. 1 illustrates a switch with a FET stack that includes a plurality of FETs and a varactor stack that includes a plurality of anti-series varactor pairs.

FIG. 1 illustrates a switch 100 with a FET stack 102 that includes a plurality of FETs 103a, 103b and a varactor stack 104 that includes a plurality of anti-series varactor pairs 105a, 105b. On the left, the switch arm (or shunt arm) made up of the FET stack 102 is in an OFF state. This generates undesirable distortion which would be advantageous to reduce. On the right, the varactor stack 104 is configured to reduce or cancel the distortion generated by the FET stack 102. As can be seen, when using a field-effect transistor (FET), the source and drain can be tied together so that the FET acts as a varactor. Other varactors may also be employed to make up the varactor pairs 105a, 105b.

In some implementations, the switch 100 can be a linearized transistor-based signal switch that includes an input 101 and an output 109 at either end of a primary signal path 106. The switch 100 includes a series transistor 107 along the primary signal path 106, a shunt transistor stack 102, and a shunt varactor stack 104.

The shunt transistor stack 102 includes multiple shunt transistors 103a, 103b connected in series between the primary signal path 106 and a reference node, which may be a ground reference, and includes a shunt control voltage input through which a shunt control voltage (Vin1) may be received and is applied to the various gates of the transistors 103a, 103b.

The shunt varactor stack 104 includes multiple anti-series varactor pairs 105a, 105b connected in series between the primary signal path 106 and a reference node, which may be a ground reference, and includes a varactor control voltage input through which a varactor control voltage (Vin2) may be received and is applied to the various gates of the varactor pairs 105a, 105b. Varactor pairs are used in an anti-series configuration to reduce or eliminate non-linearities.

The number, size, and type of transistors 103a, 103b may be selected, designed, modeled, or measured to have a known C-V curve and third order non-linearities. Accordingly, the number, size, and type of varactor pairs 105a, 105b may be selected, designed, modeled, or measured to have a C-V curve with opposing third order non-linearities. Similarly, the number, size, and type of transistors 103a, 103b may be selected, designed, modeled, or measured to have known second order non-linearities and the asymmetry of varactor pairs 105a, 105b may be selected, designed, modeled, or measured to have opposing second order non-linearities. This can be done so that intermodulation distortion products produced by the shunt transistor stack 102 are substantially negated by intermodulation distortion products produced by the shunt varactor stack 104.

An example shunt control voltage (Vin1) of −2.5 V at the control input of the shunt transistor stack 102 turns off the shunt transistor stack 102 (in keeping with an "on" state of the signal switch 100 overall). As discussed herein, the transistors 103a, 103b can have a positive C3 value when controlled to be in an off state. The varactor control voltage (Vin2) can be +2.5 V at the control input of the shunt varactor stack 104. This can place the third order non-linearity of the varactor pairs 105a, 105b to be in a condition to have a negative C3 value, in opposition to the transistors 103a, 103b. Accordingly, the third order intermodulation products produced by the shunt varactor stack 104 oppose, or offset, the third order intermodulation products produced by the shunt transistor stack 102. Similarly, the geometry or asymmetry of the varactor pairs 105a, 105b in the varactor stack 104 can be tuned to oppose, or offset, the second order intermodulation products produced by the shunt transistor stack 102.

In some embodiments, the varactor control voltage (applied to the gates of the anti-series varactor pairs 105a, 105b) may remain at a fixed voltage, e.g., +2.5 V, regardless of the on or off state of the signal switch 100 overall. For example, when the signal switch 100 is in an off state, the shunt transistor stack 102 may be in an on (conducting) state such that the shunt transistor stack 102 diverts a majority of the signal power to the reference node, and the impact of the shunt varactor stack 104 in such condition may be insignificant. Accordingly, it may not be necessary to change the varactor control voltage when changing the state of the signal switch 100 from on to off, or vice versa.

In certain implementations, the series transistor 107 may be electrically connected in various locations, such as along the primary signal path 106 before or between the connection points of the shunt transistor stack 102 and the shunt varactor stack 104. Additionally, the series transistor 107 may include multiple transistors in series (e.g., a FET stack), and in such examples there may be series transistors in any of said locations along the primary signal path 106, e.g., before, between, or after (as shown) the shunt transistor stack 102 and the shunt varactor stack 104. Similarly, in certain examples the physical electrical placement of the shunt transistor stack 102 and the shunt varactor stack 104 may be insignificant, and each may be coupled to the primary signal path 106 at differing locations relative to each other and relative to one or more series transistors 107.

Figure 2:
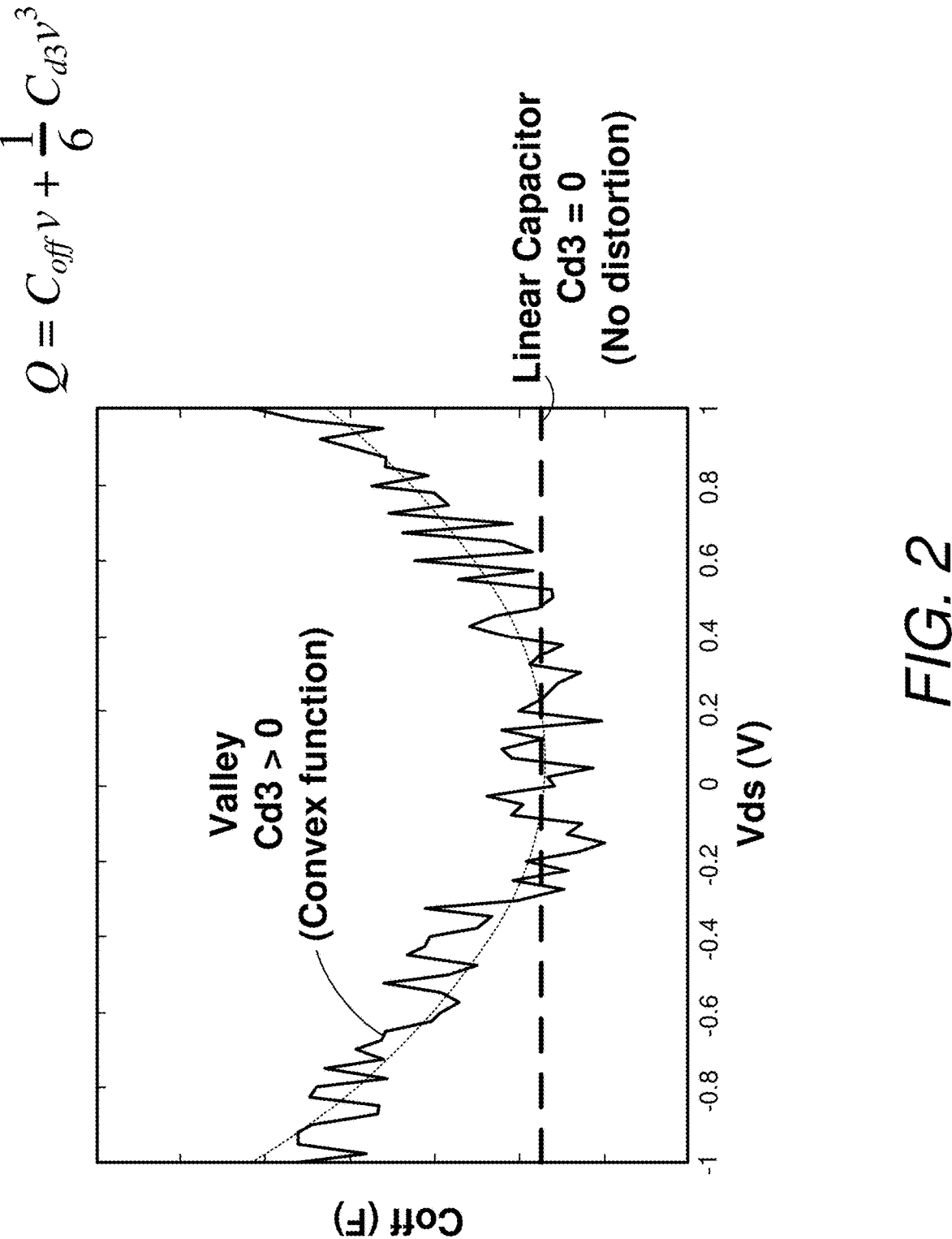
FIG. 2 illustrates a plot of Coff as a function of drain-source voltage (Vds).

FIG. 2 illustrates a plot of Coff for a FET stack (e.g., the FET stack 102 of FIG. 1) as a function of drain-source voltage (Vds). For a linear capacitor, the third order coefficient of the Taylor expansion (or Cd3) would be 0. However, the behavior of the FET stack has a positive Cd3, which is a convex function (which may be said to form a "valley").

When the series arm is off (e.g., for the switch 100 of FIG. 1), if a small signal is input into the FET stack, the change in capacitance as a function of bias can be seen. The bias is not constant implying that the capacitance is nonlinear. This nonlinearity can introduce distortion into the switch. The behavior of this C-V curve is a valley, indicating that an increase in voltage results in an increase in capacitance. The equation in the figure represents a Taylor series expansion with the coefficient Cd3 being greater than 0 for the FET stack. For a linear capacitor, Cd3 would be 0.

Figure 3:
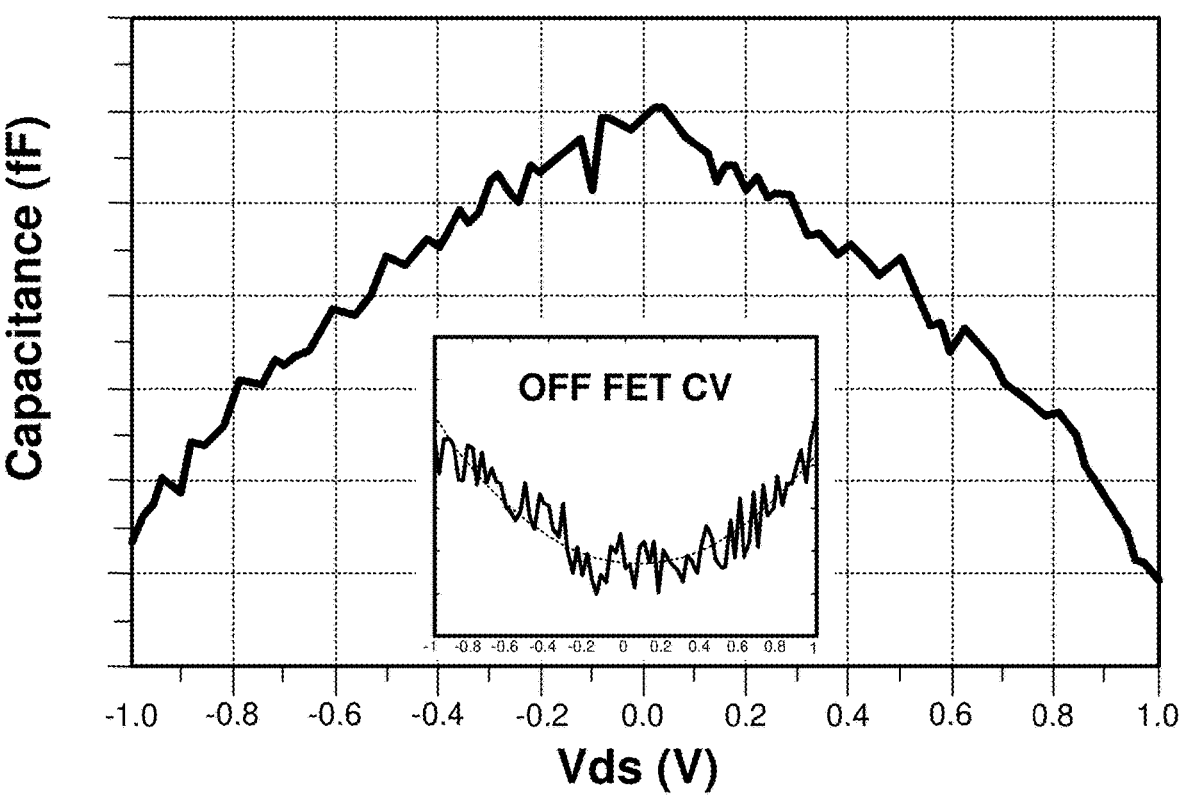
FIG. 3 illustrates the behavior of a varactor pair that is to be compared with the behavior of the FET stack of FIG. 2.
Figure 3:
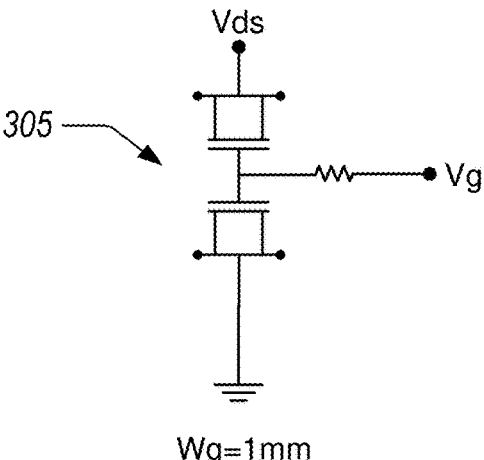

FIG. 3 illustrates the behavior of a varactor pair that is to be compared with the behavior of the FET stack of FIG. 2. The graph in FIG. 3 illustrates the behavior of a varactor pair in the OFF state. The behavior of the varactor pair is also nonlinear (Cd3 does not equal 0), but it is nonlinear in a way that forms a concave function or a hill (e.g., Cd3<0). In other words, the capacitance decreases with an increase in voltage. It should be noted also that the behavior is symmetrical indicating that there are no even order distortions affecting the capacitance. An example varactor pair 305 is illustrated below the graph and it shows first and second varactors in an anti-series configuration. In addition, the behavior of the FET stack from FIG. 2 is shown as an inset in the graph of FIG. 3 to enable easy comparison between the FET behavior and the varactor pair behavior. The capacitance of the varactor pair is about 700 fF/mm.

Figure 4:
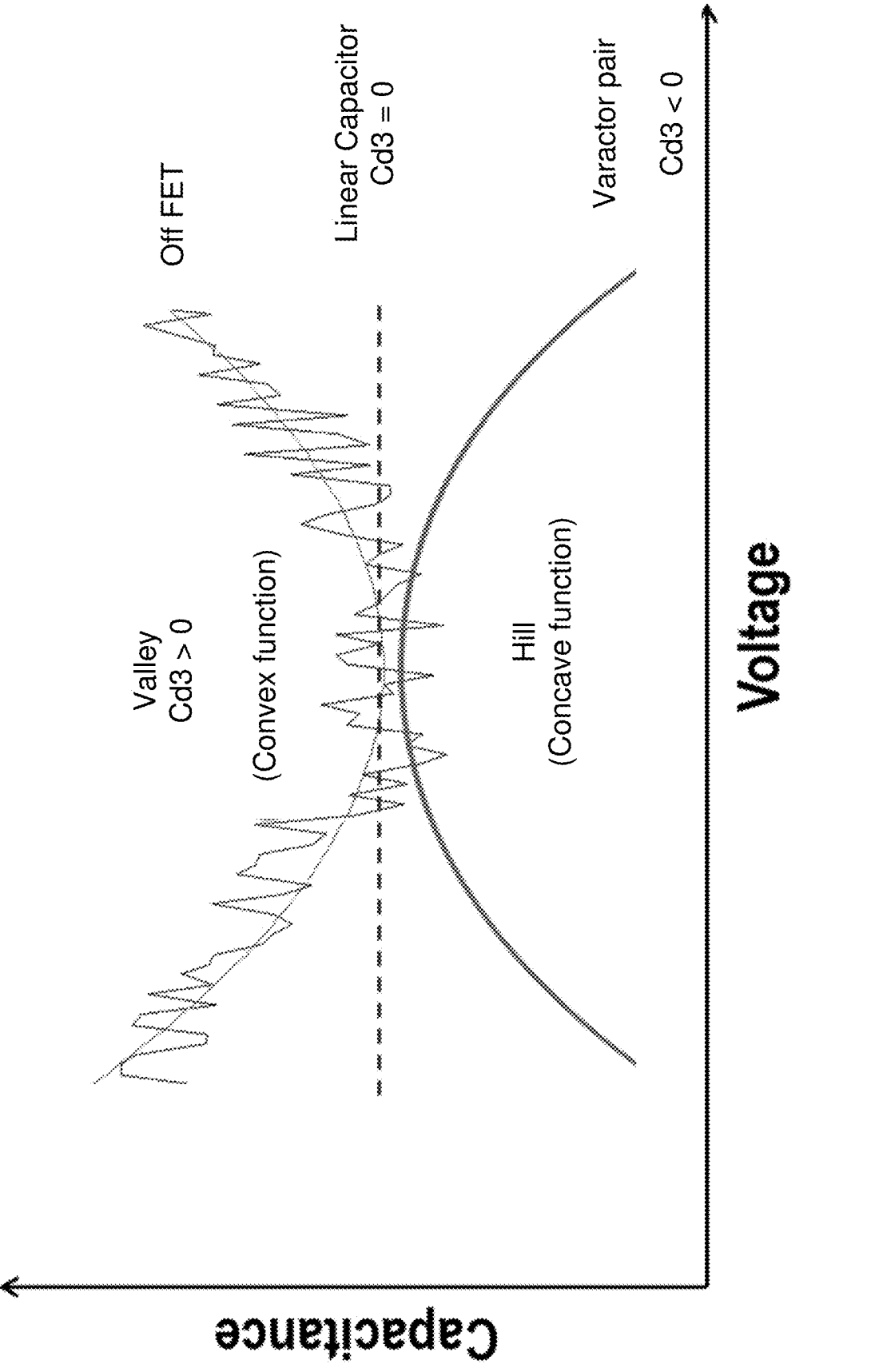
FIG. 4 illustrates a graph of the behavior of the FET (the valley function, Cd3>0) and the behavior of the varactor pair (the hill function, Cd3<0) and a linear capacitor (the dashed straight line, Cd3=0).

FIG. 4 illustrates a graph of the behavior of the FET (the valley function, Cd3>0) and the behavior of the varactor pair (the hill function, Cd3<0) and a linear capacitor (the dashed straight line, Cd3=0). The graph indicates that it is possible to build a linear capacitor by combining the FET with the anti-series varactor pair. The combination may be able to reduce Cd3 to be close to 0, thereby reducing or controlling distortions, in particular controlling third order distortions.

Figure 5:
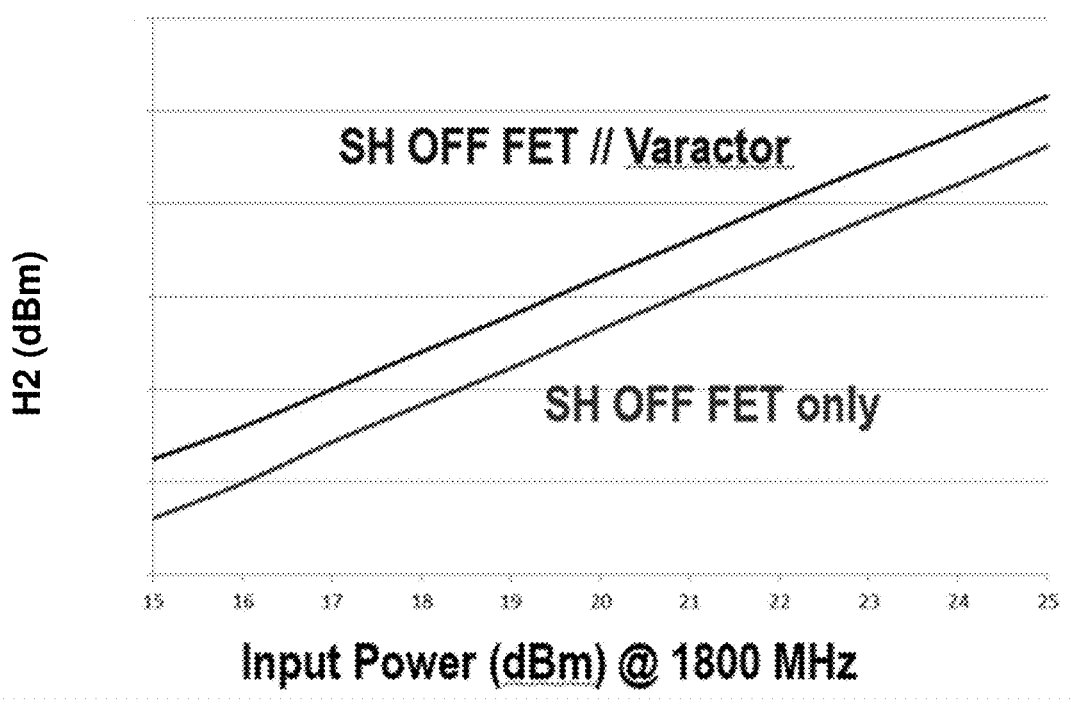
FIG. 5 illustrates 2nd order harmonics (top graph) and 3rd order harmonics (bottom graph) as a function of input power at 1800 MHZ.
Figure 5:
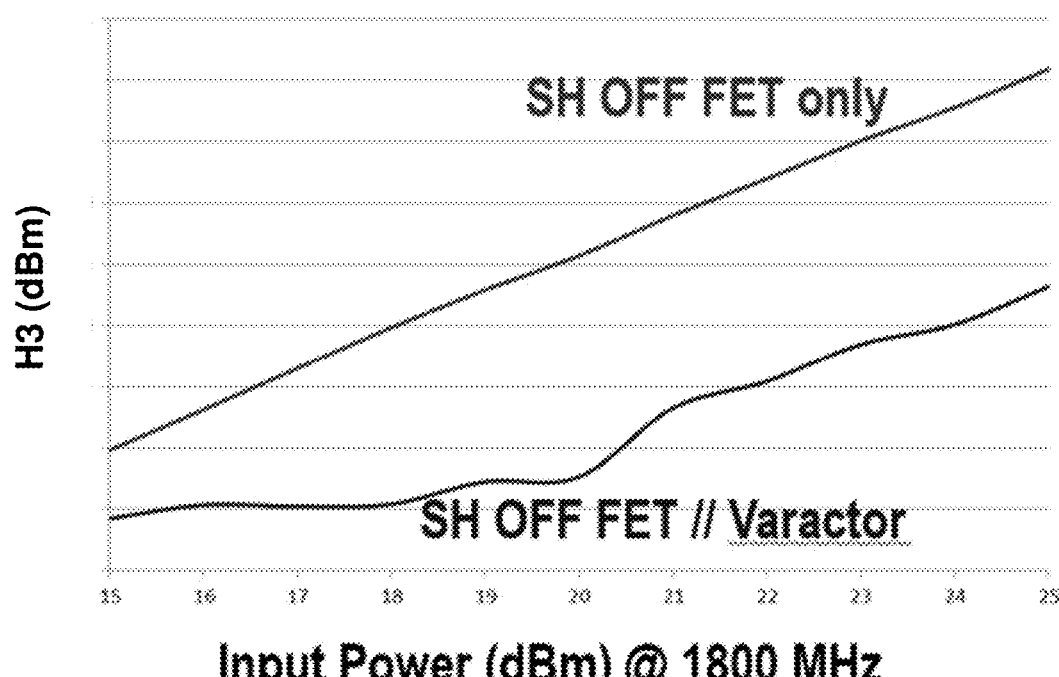

FIG. 5 illustrates 2nd order harmonics (top graph) and 3rd order harmonics (bottom graph) as a function of input power at 1800 MHZ. For the top graph, the 2nd order harmonics of the FET in the OFF state combined with the varactor pair is on top while the 2nd order harmonics of just the FET in the OFF state (without the varactor pair) is below it. For the bottom graph, the 3rd order harmonics of the FET in the OFF state combined with the varactor pair is below the 3rd order harmonics of just the FET in the OFF state (without the varactor pair). This indicates that the anti-series varactor pair reduces 3rd order harmonic distortions (or H3) of the FET or FET stack. However, the 2nd order harmonic distortions (or H2) are slightly degraded by this combination. Because it is desirable to reduce both H2 and H3 simultaneously, the disclosed circuit configurations employ asymmetrical anti-series varactor pairs to control both H2 and H3 simultaneously, as described herein.

Figure 6:
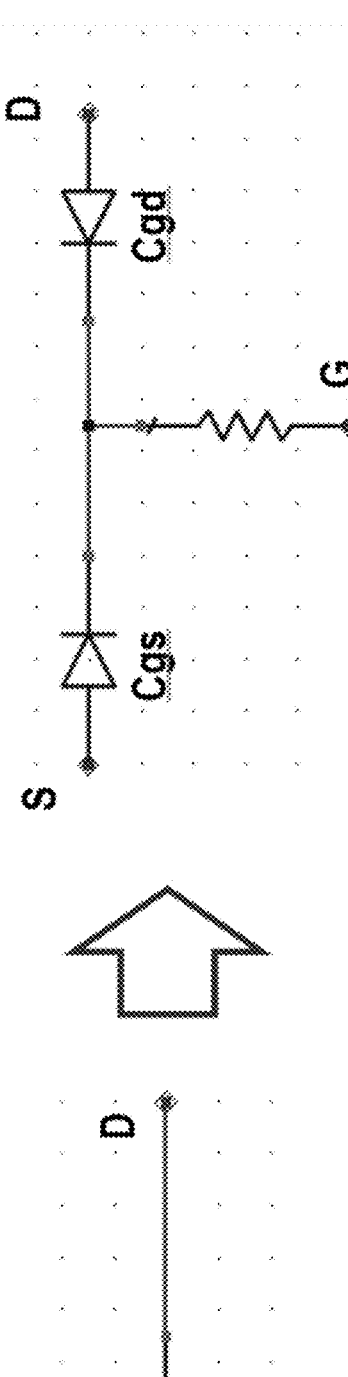
FIG. 6 illustrates that Cds behaves as an anti-series connection of Cgs and Cgd.
Figure 6:
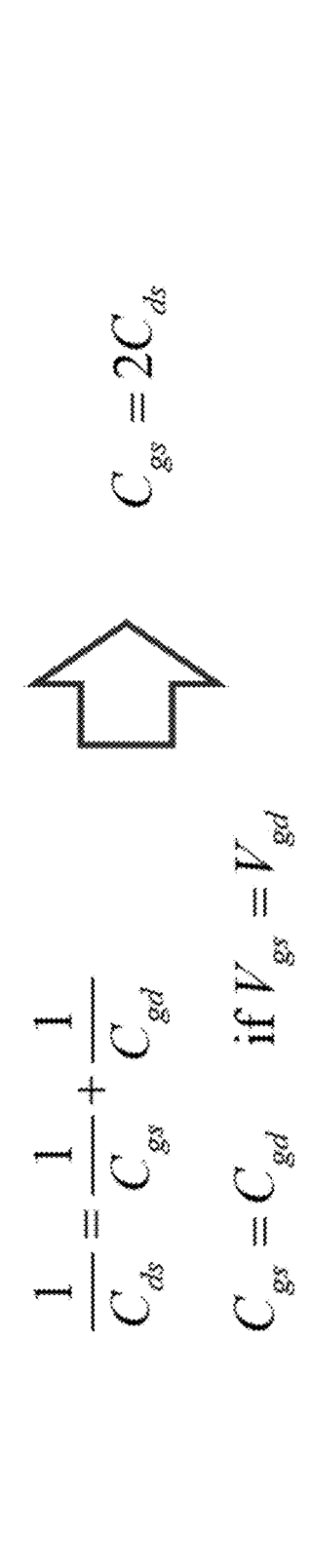

FIG. 6 illustrates that Cds behaves as an anti-series connection of Cgs and Cgd. This helps to illustrate the approximate behavior of the FET (or FET stack) in the OFF state. Thus, it is desirable to match Cgs and Cgd to improve performance of the FET (or FET stack)

Figure 7:
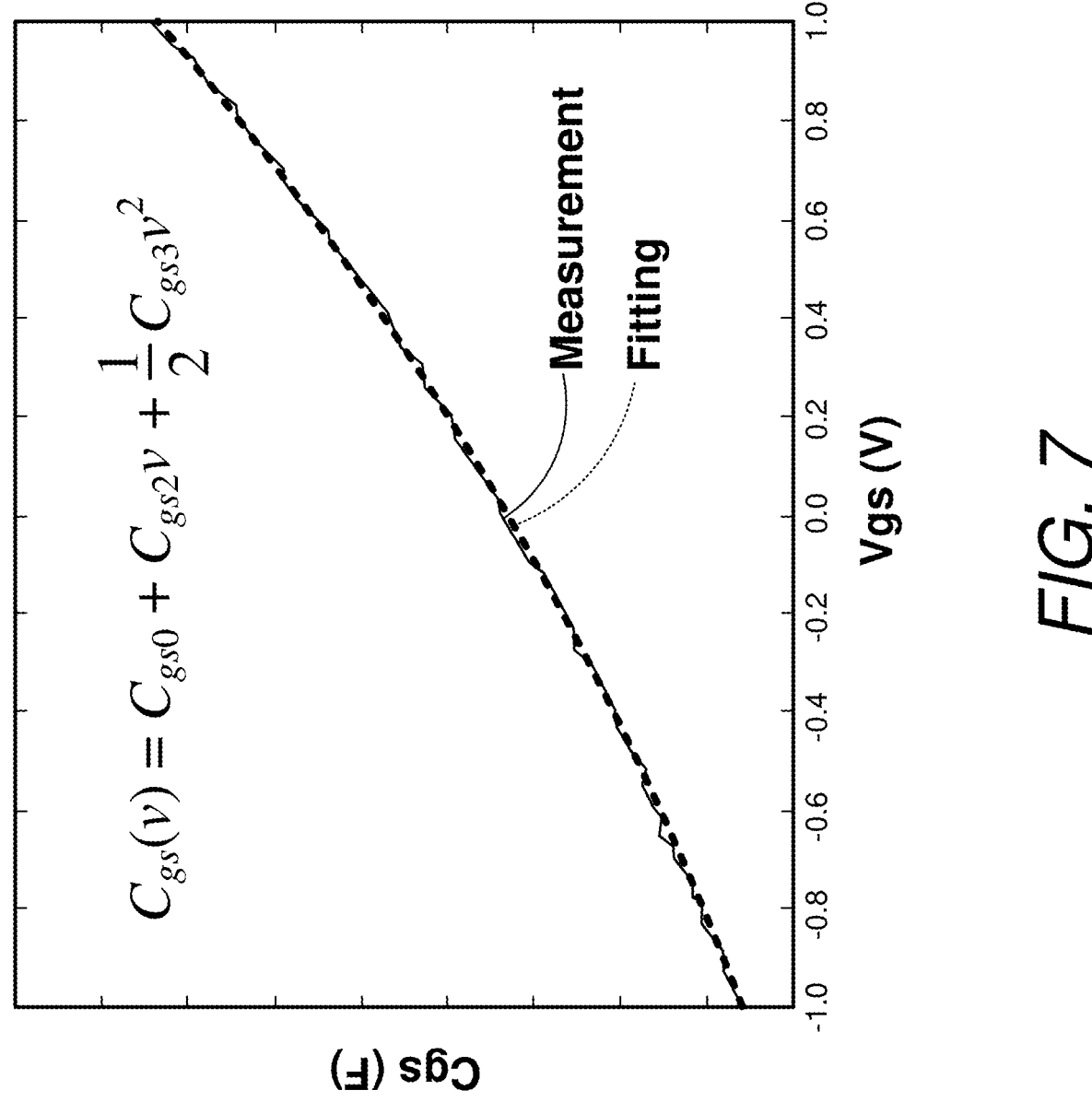
FIG. 7 illustrates simulated measurements of Cgs as a function of Vgs and a polynomial fit to the data.

FIG. 7 illustrates simulated measurements of Cgs as a function of Vgs and a polynomial fit to the data. In the fit, Cgs2 represents 2nd order harmonics and Cgs3 represents 3rd order harmonics. Cgs is not symmetrical as reflected in Cgs not being equal to 0. Thus, Cgs generates even-order distortions, which are desirable to reduce or eliminate to improve FET and switch performance.

Figure 8:
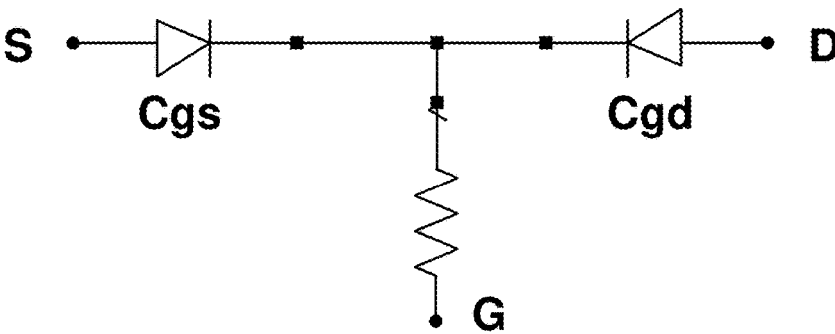
FIG. 8 illustrates a calculation of Cd3 modeling the FET in the off state as anti-series diodes (Cgs and Cgd).
Figure 8:
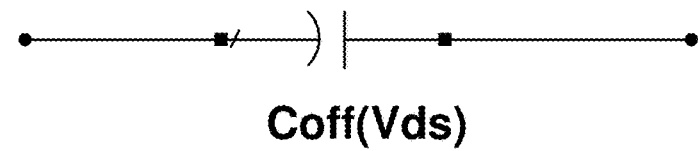

FIG. 8 illustrates a calculation of Cd3 modeling the FET in the off state as anti-series diodes (Cgs and Cgd). The FET has both Cgs and Cgd connected in an anti-series configuration. With this model, Coff can be modeled as the equation indicates in the figure and for a single Cgs or single Cgd, the combination only generates third order harmonics because the second order distortion is canceled inside the FET (due at least in part to the symmetry of Cgs and Cgd). Thus, if the FET is symmetric, it only generates 3rd order harmonics because 2nd order harmonics are canceled due to the symmetry of Cgs and Cgd. The equation in the figure illustrates the behavior of Cd3 as a function of gs3, gs2, and gs0.

Figure 9:
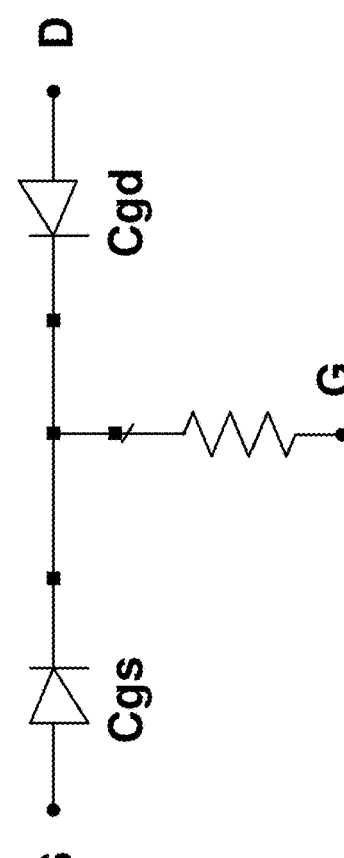
FIG. 9 illustrates that if the FET is not symmetric (in contrast to what is discussed with respect to FIG. 8), Cgs is not equal to Cgd and Cd2 is not canceled.

FIG. 9 illustrates that if the FET is not symmetric (in contrast to what is discussed with respect to FIG. 8), Cgs is not equal to Cgd and Cd2 is not canceled. The equation on the right of the figure shows the dependence of Cds on Cgs and Cgd. If, however, Cgd and Cgs were symmetrical, Cd2 would be 0. Thus, both Cgs and Cgd generate 2nd order distortions.

Figure 10:
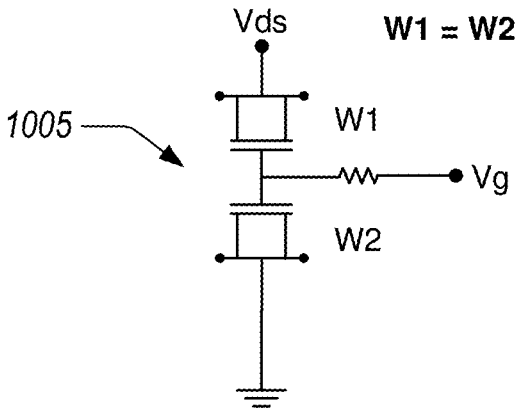
FIG. 10 illustrates a symmetrical anti-series varactor pair.

FIG. 10 illustrates a symmetrical anti-series varactor pair 1005 and FIG. 11 illustrates an asymmetrical anti-series varactor pair 1105. The symmetrical varactor pair 1005 has varactors with the same width (W1=W2) while the asymmetrical varactor pair 1105 has varactors with different widths (W1≠W2). As described herein, if the varactors are perfectly symmetrical, they can be used to control third order harmonics but cannot affect 2nd order harmonics because they produce no 2nd order distortions. Thus, if the varactor pair is asymmetric, it can generate both 2nd and 3rd order distortions. These 2nd and 3rd order distortions can then be used to control 2nd and 3rd order distortions in a FET (or FET stack). Because real FETs have asymmetries, 2nd order harmonics are produced and it is desirable to reduce or to control these distortions as well as 3rd order distortions.

FIG. 12 illustrates simulated measurements of the magnitude of 2nd and 3rd order harmonics as a function of the difference in widths of the two varactors (δW). The width of the two varactors is expressed as W1=W0−δW and W2=W0+δW, where W0 is 1 mm. The top line 1201 in the graph is the data corresponding to the third order harmonics and is a straight line. This is due at least in part to the total width being fixed because the total width of the varactor affects the magnitude of the third order distortions. The bottom line 1202 in the graph is the data corresponding to the second order harmonics and the line reaches a minimum where δW is 0, meaning that symmetrical varactor pairs have minimal 2nd order distortions. Thus, because it is desirable to generate 2nd order harmonics in the varactor pair to reduce or control 2nd order harmonics generated by the FET (or FET stack), it is desirable to implement asymmetrical varactor pairs in circuit configurations to control 2nd order harmonics as well as 3rd order harmonics generated by FET(s) in a series arm (or shunt arm) of a switch.

The graph of FIG. 12 indicates that an asymmetric varactor pair can control 2nd order distortions by controlling the ratio between the 2 varactor sizes, or that it is advantageous to control the size difference to control the magnitude of the generated 2nd order harmonics. Furthermore, the disclosed asymmetric anti-series varactor pairs can be configured to control 2nd and 3rd order harmonics independently, controlling H3 with the width (W0) and controlling H2 with the width difference (δW).

FIG. 13 illustrates simulated measurements of the phase of 2nd and 3rd order harmonics as a function of the difference in widths of the two varactors (δW). The top line 1301 is the phase of the 3rd order harmonics and the bottom line 1302 is the phase of the 2nd order harmonics. There is a 180 degree phase change around where the width difference is equal to 0. This indicates that the asymmetric anti-series varactor pair can be used to control 2nd order harmonic interaction phase by controlling the ratio of the sizes. That is, by controlling whether W1>W2 or W1<W2 the phase of the 2nd order harmonics can be flipped.

Again, this indicates that an asymmetric varactor pair can control 2nd order distortions by controlling the ratio between the 2 varactor sizes, or it is advantageous to control the size difference to control the phase of the generated 2nd order harmonics. Furthermore, the disclosed asymmetric anti-series varactor pairs can be configured to control 2nd and 3rd order harmonics independently, controlling H3 with the width (W0) and controlling H2 with the width difference (δW) and controlling the phase by controlling which varactor is larger. In short, controlling the size difference of the varactor pairs controls the magnitude and phase of the 2nd order harmonics. Where the size and magnitude of the 2nd order harmonics generated by the FET in the OFF state are known, it is possible to implement an asymmetric anti-series varactor pair to reduce or eliminate these generated 2nd order harmonics. In addition, it is possible to control 3rd order harmonics simultaneously by controlling the base width (W0) of the varactors in the asymmetric anti-series varactor pair.

FIG. 14 illustrates the effects on 2nd and 3rd order harmonics using a stack of asymmetrical varactor pairs. A stack of varactor pairs can be implemented to increase the breakdown voltage of the stack. For example, the graph of FIG. 14 illustrates a stack of 10 varactor pairs and shows that similar behavior is observed relative to a single varactor pair (compare with the graph in FIG. 12). The top line 1401 in the graph is the data corresponding to the third order harmonics and the bottom line 1402 in the graph is the data corresponding to the second order harmonics.

FIG. 15 illustrates the behavior of both symmetrical and asymmetrical varactor pairs. In such embodiments, the varactor pairs need not all be asymmetrical to provide the advantages described herein. The different lines represent the number of asymmetrical pairs in a varactor stack with the stack height being fixed to 10. Thus, the top line represents all of the varactor pairs in the varactor stack being asymmetrical while the bottom line represents only 1 pair of the 10 pairs being asymmetrical. This shows that there is another way to control 2nd order harmonics: by controlling the ratio of asymmetrical varactor pairs to symmetrical varactor pairs in the varactor stack. In the graph, the width difference δW represents the aggregate asymmetry of the stack. Thus, in some embodiments, the varactor stack does not include any symmetric anti-series varactor pairs.

Switches with Asymmetrical, Anti-Series Varactor Pairs

The disclosed asymmetric anti-series varactor pairs can be used to control both H2 and H3. The disclosed asymmetric anti-series varactor pairs can be used in switches described herein below and also switches such as those described in U.S. Pat. Pub. No. 2018/0183431, which is incorporated herein by reference in its entirety.

FIG. 16 schematically shows a radio-frequency (RF) switch 1600 configured to switch one or more signals between one or more poles 1602 and one or more throws 1604. In some embodiments, such a switch 1600 can be based on one or more field-effect transistors (FETs) such as silicon-on-insulator (SOI) FETs and can employ asymmetrical, anti-series varactor pairs to reduce or eliminate distortions, as described herein. When a particular pole is connected to a particular throw, such a path is commonly referred to as being closed or in an ON state. When a given path between a pole and a throw is not connected, such a path is commonly referred to as being open or in an OFF state. The switch 1600 can include coupling circuits, such as asymmetrical, anti-series varactor pair circuits disclosed herein, that are configured to improve performance of the switch by reducing 2nd and 3rd order harmonics. For example, asymmetrical, anti-series varactor pair circuits (which can include symmetrical, anti-series varactor pairs) disclosed herein can reduce or eliminate 2nd and 3rd order harmonics produced by FETs and/or FET stacks in the switch 1600.

FIG. 17 shows that in some implementations, the RF switch 1600 of FIG. 16 can include an RF core 1610 and an energy management (EM) core 1612. The RF core 1610 can be configured to route RF signals between the first and second ports. In the example single-pole-double-throw (SPDT) configuration shown in FIG. 17, such first and second ports can include a pole 1602a and a first throw 1604a, or the pole 1602a and a second throw 1604b.

In some embodiments, EM core 1612 can be configured to supply, for example, voltage control signals to the RF core 1610. The EM core 1612 can be further configured to provide the RF switch 1600 with logic decoding and/or power supply conditioning capabilities.

In some embodiments, the RF core 1610 can include one or more poles and one or more throws to enable passage of RF signals between one or more inputs and one or more outputs of the switch 1600. For example, the RF core 1610 can include a single-pole double-throw (SPDT or SP2T) configuration as shown in FIG. 17. The RF core 1610 can implement asymmetrical, anti-series varactor pairs to reduce distortions in the switch 1600.

In the example SPDT context, FIG. 18 shows a more detailed example configuration of an RF core 1610. The RF core 1610 is shown to include a single pole 1602a coupled to first and second throw nodes 1604a, 1604b via first and second transistors (e.g., FETs) 1620a, 1620b. The first throw node 1604a is shown to be coupled to an RF ground via FET 1622a to provide shunting capability for the node 1604a. Similarly, the second throw node 1604b is shown to be coupled to the RF ground via FET 1622b to provide shunting capability for the node 1604b. For each FET 1620a, 1620b, 1622a, 1622b, it is to be understood that a single FET in the figure can be used to represent a FET with an asymmetrical, anti-series varactor pair, to represent a FET stack with a stack of asymmetrical, anti-series varactor pairs, and/or to represent a FET stack with a stack of both symmetrical and asymmetrical, anti-series varactor pairs. The anti-series varactor pairs are coupled to the FETs or FET stacks in such a way as to reduce or to eliminate 2nd and 3rd order harmonics arising from the FETs or FET stacks, as described herein.

In an example operation, when the RF core 1610 is in a state where an RF signal is being passed between the pole 1602a and the first throw 1604a, the FET 1620a between the pole 1602a and the first throw node 1604a can be in an ON state, and the FET 1620b between the pole 1602a and the second throw node 1604b can be in an OFF state. For the shunt FETs 1622a, 1622b, the shunt FET 1622a can be in an OFF state so that the RF signal is not shunted to ground as it travels from the pole 1602*a* to the first throw node 1604*a*. The shunt FET 1622*b* associated with the second throw node 1604*b* can be in an ON state so that any RF signals or noise arriving at the RF core 1610 through the second throw node 1604*b* is shunted to the ground so as to reduce undesirable interference effects to the pole-to-first-throw operation. Varactor pairs can be operated as described herein to reduce distortions generated by the FETs.

Although the foregoing example is described in the context of a single-pole-double-throw configuration, it will be understood that the RF core can be configured with other numbers of poles and throws. For example, there may be more than one pole, and the number of throws can be less than or greater than the example number of two.

In the example of FIG. 18, the transistors between the pole 1602*a* and the two throw nodes 1604*a*, 1604*b* are depicted as single transistors. In some implementations, such switching functionalities between the pole(s) and the throw(s) can be provided by switch arm segments, where each switch arm segment includes a plurality of transistors such as FETs.

An example RF core configuration 1630 of an RF core having such switch arm segments is shown in FIG. 19. In the example, the pole 1602*a* and the first throw node 1604*a* are shown to be coupled via a first switch arm segment 1640*a*. Similarly, the pole 1602*a* and the second throw node 1604*b* are shown to be coupled via a second switch arm segment 1640*b*. The first throw node 1604*a* is shown to be capable of being shunted to an RF ground via a first shunt arm segment 1642*a*. Similarly, the second throw node 1604*b* is shown to be capable of being shunted to the RF ground via a second shunt arm segment 1642*b*.

In an example operation, when the RF core 1630 is in a state where an RF signal is being passed between the pole 1602*a* and the first throw node 1604*a*, all of the FETs in the first switch arm segment 1640*a* can be in an ON state, and all of the FETs in the second switch arm segment 1604*b* can be in an OFF state. The first shunt arm 1642*a* for the first throw node 1604*a* can have all of its FETs in an OFF state so that the RF signal is not shunted to ground as it travels from the pole 1602*a* to the first throw node 1604*a*. All of the FETs in the second shunt arm 1642*b* associated with the second throw node 1604*b* can be in an ON state so that any RF signals or noise arriving at the RF core 1630 through the second throw node 1604*b* is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 1640*a*, 1640*b*, 1642*a*, 1642*b*) can include one or more semiconductor transistors such as FETs. In some embodiments, a FET may be capable of being in a first state or a second state and can include a gate, a drain, a source, and a body (sometimes also referred to as a substrate). In some embodiments, a FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state). A series of coupled FETs can be referred to as a stack, a stack of FETs, or a FET stack.

At least some of the present disclosure relates to how a FET or a group of FETs can be controlled to provide switching functionalities in desirable manners. FIG. 20 schematically shows that in some implementations, such controlling of a FET 1620 can be facilitated by a circuit 1650 configured to bias and/or couple one or more portions of the FET 1620. In some embodiments, such a circuit 1650 can include one or more circuits configured to bias and/or couple a gate of the FET 1620, bias and/or couple a body of the FET 1620, and/or couple a source/drain of the FET 1620.

Schematic examples of how such biasing and/or coupling of different parts of one or more FETs are described in reference to FIG. 21. In FIG. 21, a switch arm segment 1640 (that can be, for example, one of the example switch arm segments 1640*a*, 1640*b*, 1642*a*, 1642*b* of the example of FIG. 19) between nodes 1644, 1646 is shown to include a plurality of FETs 1620. Operations of such FETs can be controlled and/or facilitated by a gate bias/coupling circuit 1650*a*, a body bias/coupling circuit 1650*c*, and/or a source/drain coupling circuit 1650*b*.

Examples of Implementations in Products

Various examples of FET-based switch circuits and bias/coupling configurations described herein can be implemented in a number of different ways and at different product levels. Some of such product implementations are described by way of examples.

FIG. 22 illustrates that, in some embodiments, some or all of the devices having one or more features as described herein may be implemented in a module. Such a module may be, for example, a front-end module (FEM). In the example of FIG. 22, a radio frequency (RF) module 1600 can include a packaging substrate 1602, and a number of components may be mounted on such a packaging substrate. For example, a front-end power management integrated circuit (FE-PMIC) component 1604, a power amplifier assembly 1606, a match component 1608, and a duplexer assembly 1603 may be mounted and/or implemented on and/or within the packaging substrate 1602. The FE-PMIC component 1604 includes a supply which may be a power supply (e.g., a battery, a voltage/power source) and/or may be coupled to a power supply. Other components such as a number of surface mount technology (SMT) devices 1614 can also be mounted on the packaging substrate 1602. Switch circuits 1605 can be implemented on the packaging substrate 1602, wherein the switch circuits 1605 include asymmetric, anti-series varactor pairs as described herein. Although all of the various components are depicted as being laid out on the packaging substrate 1602, it will be understood that some component(s) may be implemented over other component(s). In some embodiments, the components of the RF module 1600 and one or more serial buses/interfaces (e.g., a RFFE bus/interface) used by the components of the RF module 1600 may implement and/or perform one or more features as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 23 schematically depicts an example wireless device 1700 having one or more advantageous features described herein. In the context of various switches and various control circuit configurations as described herein, a switch 1705 and a control circuit 1710 can be part of a switch module 1715 integrated into a front-end module 1740. In some embodiments, such a switch module 1715 can include asymmetric, anti-series varactor pairs to reduce distortions generated in switches.

In the example wireless device 1700, power amplifiers 1728 can provide an amplified RF signal to the switch 1705 via diplexers 1726. The switch 1705 can route the amplified RF signal to an antenna 1720. The PAs 1728 can receive an unamplified RF signal from a transceiver 1730 that can be configured and operated in known manners. The transceiver 1730 can also be configured to process received signals. The transceiver 1730 is shown to interact with a baseband sub-system 1711 that is configured to provide conversion between data and/or voice signals suitable for a user and RF signals suitable for the transceiver 1730. The transceiver 1730 is also shown to be connected to a power management component 1706 that is configured to manage power from a battery 1708 for the operation of the wireless device 1700. Such a power management component can also control operations of the baseband sub-system 1711 and the module 1740.

The baseband sub-system 1711 is shown to be connected to a user interface 1702 to facilitate various input and output of voice and/or data provided to and received from the user. The baseband sub-system 1711 can also be connected to a memory 1704 that is configured to store data and/or instructions to facilitate the operation of the wireless device, and/or to provide storage of information for the user.

In some embodiments, the diplexers 1726 can allow transmit and receive operations to be performed simultaneously using a common antenna (e.g., antenna 1720). Received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The implementations described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. A TDMA system may implement GSM (Global System for Mobile Communications) or some other standards known in the art. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An OFDM system may implement IEEE 802.11 or some other standards known in the art. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA. A SC-FDMA system may implement 3GPP-LTE (3rd Generation Partnership Project Long Term Evolution), LTE-Advanced, LTE-Advanced Pro (4.5G) or any other standards and/or ad hoc wireless techniques known in the art.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), a smart phone, a tablet computing device or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
a series arm coupled between an input node and an output node;
a shunt arm having a set of field-effect transistors, the shunt arm coupled between the series arm and a reference node; and
a varactor stack comprising a plurality of anti-series varactor pairs with at least one anti-series varactor pair being an anti-series asymmetric varactor pair with a first varactor having a width that is equal to a base width plus a width difference and a second varactor having a width that is equal to the base width minus the width difference and at least one anti-series varactor pair being an anti-series symmetric varactor pair with each varactor having a width equal to the base width, the varactor stack coupled in parallel to the shunt arm between the series arm and the reference potential node, a ratio of a number of asymmetric varactor pairs to a number of symmetric varactor pairs of the plurality of anti-series varactor pairs configured to reduce second-order harmonics generated by the set of field effect transistors in the shunt arm.

2. The switch of claim 1 wherein the base width is configured to reduce third-order harmonics generated by the set of field-effect transistors in the shunt arm and the width difference is configured to further reduce second-order harmonics generated by the set of field-effect transistors in the shunt arm.

3. The switch of claim 1 wherein the varactor stack includes a plurality of anti-series asymmetric varactor pairs.

4. The switch of claim 3 wherein each varactor pair of the plurality of anti-series asymmetric varactor pairs has a same width difference.

5. The switch of claim 4 wherein an aggregate of the width differences for all of the anti-series asymmetric varactor pairs is configured to reduce the second-order harmonics generated by the set of field-effect transistors in the shunt arm.

6. The switch of claim 3 wherein each varactor pair of the plurality of anti-series asymmetric varactor pairs has a different width difference.

7. The switch of claim 6 wherein an aggregate of the width differences for all of the anti-series asymmetric varactor pairs is configured to reduce the second-order harmonics generated by the set of field-effect transistors in the shunt arm.

8. The switch of claim 1 wherein the series arm comprises a plurality of field-effect transistors.

9. The switch of claim 1, wherein the ratio is greater than or equal to 1.

10. The switch of claim 1, wherein the ratio is less than or equal to 1.

11. A radio-frequency switch module comprising:
a packaging substrate configured to receive a plurality of components;
a semiconductor die mounted on the packaging substrate, the semiconductor die including a switch, the switch including a series arm coupled between an input node and an output node; the switch including a shunt arm having a set of field-effect transistors, the shunt arm coupled between the series arm and a reference node; the switch including a varactor stack comprising a plurality of anti-series varactor pair pairs with at least one anti-series varactor pair being an anti-series asymmetric varactor pair with a first varactor having a width that is equal to a base width plus a width difference and a second varactor having a width that is equal to the base width minus the width difference and at least one anti-series varactor pair being an anti-series symmetric varactor pair with each varactor having a width equal to the base width, the varactor stack coupled in parallel to the shunt arm between the series arm and the reference potential node, a ratio of a number of asymmetric varactor pairs to a number of symmetric varactor pairs of the plurality of anti-series varactor pairs configured to reduce second-order harmonics generated by the set of field effect transistors in the shunt arm.

12. The switch module of claim 11 wherein the base width is configured to reduce third-order harmonics generated by the set of field-effect transistors in the shunt arm and the width difference is configured to further reduce second-order harmonics generated by the set of field-effect transistors in the shunt arm.

13. The switch module of claim 11 wherein the varactor stack includes a plurality of anti-series asymmetric varactor pairs.

14. The switch module of claim 13 wherein each varactor pair of the plurality of anti-series asymmetric varactor pairs has a same width difference.

15. The switch module of claim 14 wherein an aggregate of the width differences for all of the anti-series asymmetric varactor pairs is configured to reduce the second-order harmonics generated by the set of field-effect transistors in the shunt arm.

16. The switch module of claim 13 wherein each varactor pair of the plurality of anti-series asymmetric varactor pairs has a different width difference.

17. The switch module of claim 16 wherein an aggregate of the width differences for all of the anti-series asymmetric varactor pairs is configured to reduce the second-order harmonics generated by the set of field-effect transistors in the shunt arm.

18. The switch of claim 1, wherein the ratio is greater than or equal to 1.

19. The switch of claim 1, wherein the ratio is less than or equal to 1.

20. A wireless device comprising:

a transceiver configured to process radio-frequency (RF) signals;

an antenna in communication with the transceiver configured to facilitate transmission of an amplified RF signal;

a power amplifier connected to the transceiver and configured to generate the amplified RF signal; and a switch connected to the antenna and the power amplifier and configured to selectively route the amplified RF signal to the antenna, the switch including a series arm coupled between an input node and an output node; the switch including a shunt arm having a set of field-effect transistors, the shunt arm coupled between the series arm and a reference node; the switch including a varactor stack comprising a plurality of anti-series varactor pair pairs with at least one anti-series varactor pair being an anti-series asymmetric varactor pair with a first varactor having a width that is equal to a base width plus a width difference and a second varactor having a width that is equal to the base width minus the width difference and at least one anti-series varactor pair being an anti-series symmetric varactor pair with each varactor having a width equal to the base width, the varactor stack coupled in parallel to the shunt arm between the series arm and the reference potential node, a ratio of a number of asymmetric varactor pairs to a number of symmetric varactor pairs of the plurality of anti-series varactor pairs configured to reduce second-order harmonics generated by the set of field effect transistors in the shunt arm.

* * * * *